(12) United States Patent
Hongo et al.

(10) Patent No.: US 7,172,979 B2
(45) Date of Patent: Feb. 6, 2007

(54) SUBSTRATE PROCESSING APPARATUS AND METHOD

(75) Inventors: Akihisa Hongo, Tokyo (JP); Xinming Wang, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/481,424

(22) PCT Filed: Dec. 26, 2002

(86) PCT No.: PCT/JP02/13635

§ 371 (c)(1),
(2), (4) Date: May 18, 2004

(87) PCT Pub. No.: WO03/056614

PCT Pub. Date: Jul. 10, 2003

(65) Prior Publication Data

US 2004/0231794 A1 Nov. 25, 2004

(30) Foreign Application Priority Data

Dec. 27, 2001 (JP) .............................. 2001-397960

(51) Int. Cl.
*H01L 21/469* (2006.01)
*B08B 3/00* (2006.01)
*B05C 11/00* (2006.01)

(52) U.S. Cl. .................. 438/782; 134/95.3; 118/73

(58) Field of Classification Search ................ 438/782; 118/73; 134/95.3, 2
See application file for complete search history.

(56) References Cited

U.S. PATENT DOCUMENTS

| | | | | |
|---|---|---|---|---|
| 5,169,491 A | * | 12/1992 | Doan | ......................... 438/693 |
| 6,709,563 B2 | * | 3/2004 | Nagai et al. | ................. 205/123 |
| 6,874,516 B2 | * | 4/2005 | Matsuno et al. | ............ 134/148 |
| 2002/0006876 A1 | * | 1/2002 | Hongo et al. | ............... 505/191 |
| 2002/0157686 A1 | * | 10/2002 | Kenny et al. | ................ 134/1.3 |
| 2002/0179120 A1 | * | 12/2002 | Ono et al. | ..................... 134/26 |
| 2003/0024645 A1 | | 2/2003 | Orii et al. | |
| 2004/0084318 A1 | * | 5/2004 | Cohen | ......................... 205/98 |
| 2004/0182277 A1 | * | 9/2004 | Inoue et al. | ............... 106/1.22 |
| 2004/0234696 A1 | * | 11/2004 | Hongo et al. | ............... 427/328 |
| 2004/0235237 A1 | * | 11/2004 | Inoue et al. | ................ 438/232 |
| 2004/0235298 A1 | * | 11/2004 | Inoue et al. | ................ 438/687 |
| 2004/0237896 A1 | * | 12/2004 | Hongo | ...................... 118/719 |

FOREIGN PATENT DOCUMENTS

| | | |
|---|---|---|
| JP | 11-26415 | 1/1999 |
| JP | 2001-316879 | 11/2001 |
| JP | 2003-45839 | 2/2003 |

* cited by examiner

*Primary Examiner*—Matt Smith
(74) *Attorney, Agent, or Firm*—Wenderoth, Lind & Ponack, L.L.P.

(57) ABSTRACT

A substrate processing apparatus has a substrate holder for detachably holding a substrate so that a surface, to be processed, of the substrate faces downward, and a sealing ring for sealing a peripheral portion of the surface, to be processed, of the substrate held by the substrate holder. The substrate processing apparatus also has a plurality of ejection nozzles disposed below the substrate holder for ejecting a treatment solution toward the surface, to be processed, of the substrate held by the substrate holder, and a mechanism for rotating and vertically moving the substrate holder and the ejection nozzles relative to each other.

14 Claims, 23 Drawing Sheets

SUBSTRATE PROCESSING APPARATUS AND METHOD

TECHNICAL FIELD

The present invention relates to a substrate processing apparatus and method, and more particularly to a substrate processing apparatus and method useful for pretreatment of an electroless plating process by which interconnections having an electrically conductive material, such as copper or silver, are embedded in fine recesses for interconnections which are formed in the surface of a substrate such as a semiconductor substrate or by which a protective layer is formed on the surface of interconnections for protecting the surface of the interconnections, and useful for cleaning the surface of a substrate polished by chemical mechanical polishing (CMP) with a chemical solution.

BACKGROUND ART

In recent years, as the processing speed and integration of semiconductor chips have become higher, there has been a growing tendency to replace aluminum or aluminum alloy as a metallic material for forming interconnection circuits on a semiconductor substrate with copper having a low electric resistivity and a high electromigration resistance. These kinds of copper interconnections are generally formed by filling copper into fine recesses formed in the surface of the substrate. As a method for forming copper interconnections, a plating process has generally been performed. When copper interconnections are formed on a substrate by an electrolytic plating process, a seed layer, which is used as a feeding layer in the electrolytic plating, is formed on the surface of a barrier layer made of TaN or the like, and then a copper film is formed on the surface of the seed layer by the electrolytic plating process. Thereafter, the surface of the substrate is polished to a flat finish by a chemical mechanical polishing (CMP) process.

In the case of interconnections formed by such a process, the embedded interconnections have exposed surfaces after the planarizing process. When an additional embedded interconnection structure is formed on such exposed surfaces of the interconnections, the following problems may arise. For example, during formation of an interlayer dielectric of $SiO_2$ in the next process, the exposed surfaces of the pre-formed interconnections are likely to be oxidized. Further, upon etching of the $SiO_2$ layer to form contact holes, the exposed surface of the pre-formed interconnections may be contaminated at the bottoms of the contact holes by an etchant, a peeled resist, and the like. Moreover, in the case of copper interconnections, it is feared that copper may be diffused.

In view of the above drawbacks, for example, it may be considered to selectively cover the surface of the copper interconnections with a protective layer (plated film) of Ni—B alloy or the like which has a good adhesion to a metallic material for forming interconnection circuits, such as silver or copper, and has a low resistivity ($\rho$). The Ni—B alloy film can be formed selectively on the surface of the copper film or the like by an electroless plating process with the use of an electroless plating solution that contains nickel ions, a complexing agent for nickel ions, and an alkylamine borane or a borohydride compound as a reducing agent for nickel ions, for example.

When a seed layer is formed on the surface of a substrate by an electroless plating process, or when a protective layer (cap plated film) is formed on the surface of a copper film or the like by an electroless plating process, it is necessary to perform pretreatment processes including an Sn adsorption process for substituting Sn for Pd with an $SnCl_2$ solution or the like and a Pd substitution process for depositing Pd as a catalyst in the electroless plating process on the substrate with a $PdCl_2$ solution or the like. Additionally, these processes need a rinsing process (cleaning process) with pure water, respectively. The two-stage pretreatment process may be performed with the use of a catalyst of one solution of Pd/Sn colloid. In this case, it is also necessary to perform a rinsing process with pure water.

The pretreatment process of the electroless plating process (Sn adsorption process or Pd substitution process) and the rinsing process after the pretreatment process (cleaning process) have heretofore been performed as follows. A substrate is laterally held by a vertically movable substrate holder and immersed (dipped) into a treatment solution in a treatment chamber. Alternatively, a substrate is held by a substrate holder so that the surface to be processed faces upward, and a treatment solution is supplied to the upper surface (to be processed) of the substrate held by the substrate holder.

The pretreatment process of the electroless plating process in which the substrate is immersed in the treatment solution utilizes a diffusion effect, and the solution is not positively supplied to the surface, to be processed, of the substrate. Therefore, contaminants attached to the surface to be processed and dissolved ions are removed from the surface of the substrate so slowly that the processing time becomes long, and the surface of the substrate may be recontaminated by the contaminants and the dissolved ions.

In the pretreatment process of the electroless plating process in which the substrate is held so as to face upward, it is necessary to seal the peripheral portion of the substrate by a sealing member in order to prevent the reverse side of the substrate from being contaminated. When the peripheral portion of the substrate is thus sealed by the sealing member, the treatment solution is collected on the surface of the substrate. In this manner, this method also has the same problems as the immersing process described above. On the other hand, if the sealing member is not used, then the reverse side of the substrate cannot effectively be prevented from being contaminated.

SUMMARY OF INVENTION

The present invention has been made in view of the above drawbacks. It is, therefore, an object of the present invention to provide a substrate processing apparatus and method which can efficiently perform a pretreatment process of an electroless plating process, a post-cleaning process after CMP, or the like while preventing a surface, to be processed, of a substrate from being recontaminated.

According to a first aspect of the present invention, there is provided a substrate processing apparatus comprising: a substrate holder for detachably holding a substrate so that a surface, to be processed, of the substrate faces downward; a sealing ring for sealing a peripheral portion of the surface, to be processed, of the substrate held by the substrate holder; a plurality of ejection nozzles disposed below the substrate holder for ejecting a treatment solution toward the surface, to be processed, of the substrate held by the substrate holder; and a mechanism for at least one of rotating and vertically moving the substrate holder and the plurality of ejection nozzles relative to each other.

With the above arrangement, a fresh treatment solution is positively supplied to the surface, to be processed, of the substrate. Thus, the surface, to be processed, of the substrate is always brought into contact with a fresh treatment solution. Therefore, the surface to be processed is prevented from being recontaminated. Further, contaminants attached to the surface of the substrate and dissolved ions are promoted to be quickly removed from the surface of the substrate to thus perform treatment of the substrate efficiently in a short time. Furthermore, since the peripheral portion of the surface to be processed is sealed by the sealing ring, the reverse side of the substrate is effectively prevented from being contaminated. While the substrate and the ejection nozzles are being rotated and/or vertically moved relative to each other, a fresh treatment solution is positively supplied to the surface of the substrate. As a result, the treatment solution can be supplied uniformly to the entire surface of the substrate while lessening pressures applied to the surface of the substrate.

According to a preferred aspect of the present invention, at least one of the plurality of ejection nozzles is operable to adjust kinetic energy of the treatment solution to be ejected toward the substrate held by the substrate holder. With this configuration, it is possible to adjust pressures applied to the surface, to be processed, of the substrate when the treatment solution is brought into contact with the surface of the substrate.

According to a preferred aspect of the present invention, the plurality of ejection nozzles are disposed linearly along a radial direction of the substrate, and comprise a conical nozzle disposed at a central position and fan-shaped nozzles (flat spray nozzles) at side positions of the conical nozzle. With the fan-shaped nozzles used as the ejection nozzles, the number of the ejection nozzles can be reduced because of their wider spray angle, and it is possible to adjust pressures to be applied to the surface of the substrate with a wider range. Further, with the conical nozzle disposed at the central position for applying a relatively lower pressure to a wide region, pressures applied to the central region of the surface of the substrate are lessened, and uniform pressures can be applied to the surface of the substrate.

According to a preferred aspect of the present invention, the plurality of ejection nozzles are disposed so as to be distributed uniformly over an entire surface of the substrate held by the substrate holder. With this arrangement, even if the substrate and the ejection nozzles are relatively rotated not only at a high speed, but also at an extremely low speed, the treatment solution can be supplied uniformly over the entire surface of the substrate.

According to a second aspect of the present invention, there is provided a method of processing a substrate, the method comprising: holding a substrate so that a surface, to be processed, of the substrate faces downward; sealing a peripheral portion of the surface, to be processed, of the substrate; and ejecting a treatment solution toward the surface, to be processed, of the substrate from a plurality of ejection nozzles while at least one of rotating and vertically moving the substrate and the plurality of ejection nozzles relative to each other.

The above and other objects, features, and advantages of the present invention will be apparent from the following description when taken in conjunction with the accompanying drawings which illustrate preferred embodiments of the present invention by way of example.

BEST MODE FOR CARRYING OUT THE INVENTION

A substrate processing apparatus according to embodiments of the present invention will be described in detail with reference to the accompanying drawings.

Figure 1A:
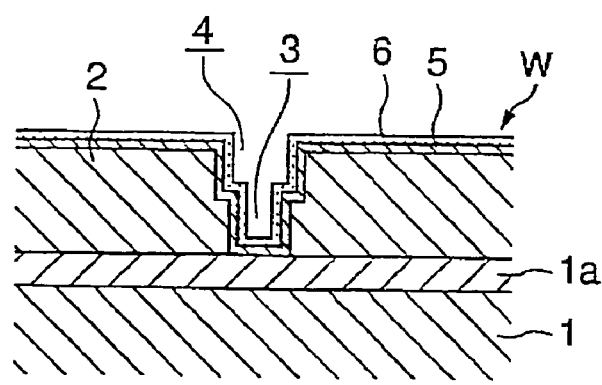
FIGS. 1A through 1D are schematic views showing an example of a process for forming an interconnection in a semiconductor substrate by copper plating.

FIGS. 1A through 1D show an example of a process for forming a copper interconnection in a semiconductor apparatus. As shown in FIG. 1A, an insulating film 2 of $SiO_2$ or the like is deposited on an electrically conductive layer 1a on a semiconductor base 1 on which a semiconductor device has been formed. A contact hole 3 and an interconnection groove 4 are formed in the insulating film 2 by a lithography etching technology. Then, a barrier layer 5 made of TaN or the like is formed on the insulating film 2, and a seed layer 6, which is used as a feeding layer in electrolytic plating, is formed on the barrier layer 5 by sputtering or the like.

Figure 1B:
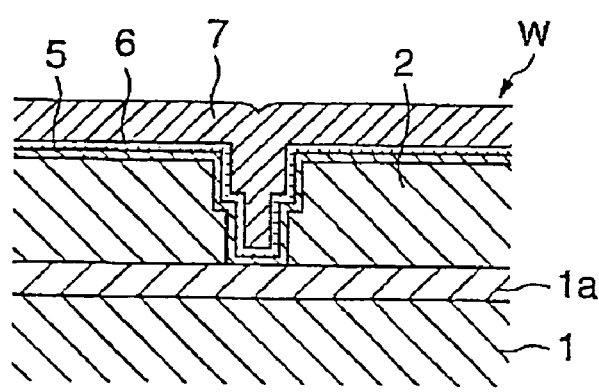
Figure 1C:
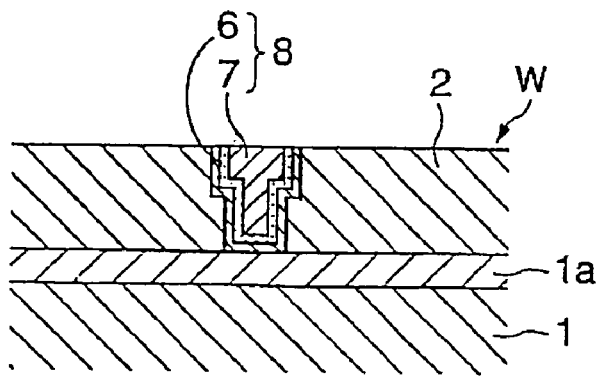
Figure 1D:
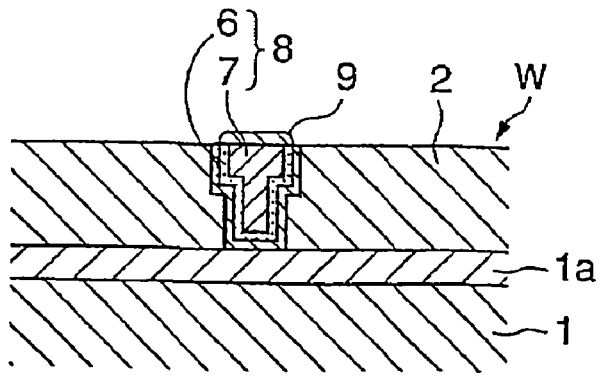

Subsequently, as shown in FIG. 1B, the surface of the substrate W is plated with copper to fill the contact hole 3 and the interconnection groove 4 with copper and to form a copper film 7 on the insulating film 2. Thereafter, the surface of the substrate W is polished by chemical mechanical polishing (CMP) to remove the copper film 7 from the insulating film 2 so that the surface of the copper film 7 filled in the contact hole 3 and the interconnection groove 4 is made substantially even with the surface of the insulating film 2. Thus, as shown in FIG. 1C, an interconnection 8 comprising the copper seed layer 6 and the copper film 7 is formed in the insulating layer 2. Subsequently, for example, an electroless Ni—B plating process is performed on the surface of the substrate W to form a protective layer (plated film) 9 of Ni—B alloy selectively on the exposed surface of the interconnection 8 as shown in FIG. 1D. Thus, the interconnection 8 can be protected by the protective layer 9.

Figure 2:
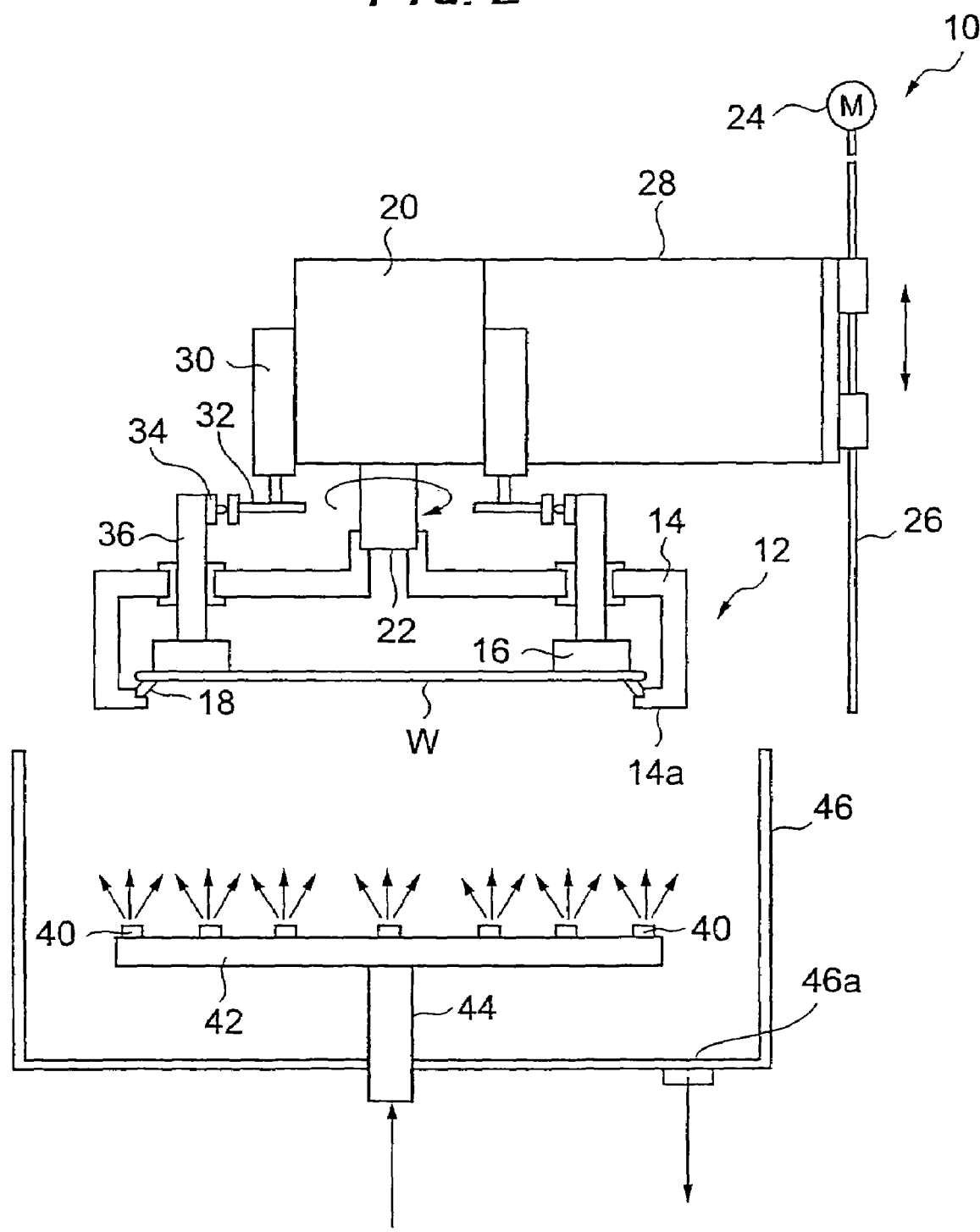
FIG. 2 is a cross-sectional view showing a substrate processing apparatus according to an embodiment of the present invention.

FIG. 2 is a schematic view showing a substrate processing apparatus 10 according to an embodiment of the present invention. The substrate processing apparatus is used in a pretreatment process and a rinsing process after the pretreatment process when an electroless plating process is performed for formation of the barrier layer 5 as shown in FIG. 1A, reinforcement of the cooper seed layer 6 as shown in FIG. 1A, deposition of the copper layer 7 as shown in FIG. 1B, or formation of the protective layer (plated film) 9 as shown in FIG. 1D.

The substrate processing apparatus 10 (as a pretreatment apparatus of an electroless plating process) has a substrate holder 12 for detachably holding a substrate W such as a semiconductor wafer so that the surface (to be processed) of the substrate W faces downward. The substrate holder 12 has a housing 14 for housing the substrate W in a downwardly opened space, and a vertically movable annular substrate presser 16 disposed in the housing 14. The housing 14 has a radially inwardly projecting portion 14a at the lower end thereof, and a sealing ring 18 mounted on the upper surface of the projecting portion 14a.

The substrate W is introduced into the interior of the housing 14, and the peripheral portion of the substrate W is brought into contact with the sealing ring 18. Thus, the substrate W is placed and held on the projecting portion 14a. In this state, the substrate presser 16 is lowered to sandwich the peripheral portion of the substrate W between the projecting portion 14a and the substrate presser 16 of the housing 14. At that time, the sealing ring 18 is squashed to seal the peripheral portion of the substrate W.

The housing 14 is coupled to an output shaft 22 of a motor 20 for rotation. The motor 20 is fixed to a vertically movable arm 28, which is coupled via a ball screw 26 to a motor 24 for vertical movement. When the motor 24 is driven, the arm 28 is vertically moved via the ball screw 26. The vertically movable arm 28 has a cylinder 30 as a housing for the motor 20 so as to extend in a downward direction. The cylinder 30 has a rod connected to a vertical movable plate 32 which is in the form of a hollow disk. A bearing 34 is mounted on an outer circumferential surface of the vertical movable plate 32. A pressing rod 36 is mounted on an outer ring of the bearing 34 so as to extend in a downward direction. The pressing rod 36 extends downward through the upper wall of the housing 14, and the substrate presser 16 is connected to the lower end of the pressing rod 36.

Thus, the substrate W is held by the substrate holder 12 while being sealed by the sealing ring 18. In this state, when the motor 20 for rotation is driven, the substrate W is rotated together with the substrate holder 12. When the motor 24 for vertical movement is driven, the substrate W is vertically moved (lifted and lowered) together with the substrate holder 12.

As shown in FIG. 2, the substrate processing apparatus 10 has a nozzle head 42 disposed horizontally underneath the substrate holder 12. The nozzle head 42 has a plurality of ejection nozzles 40 for ejecting a treatment solution toward the substrate W held by the substrate holder 12. The nozzle head 42 is in the form of a rod extending in the radial direction of the substrate W and having substantially the same length as the diameter of the substrate W held by the substrate holder 12. The nozzle head 42 is connected to an upper end of a fixed shaft 44 which extends vertically. The fixed shaft 44 is connected to treatment solution supply pipes (not shown). Thus, the treatment solution is supplied through the fixed shaft 44 to the nozzle head 42, then flows through the nozzle head 42 into each of the respective ejection nozzles 40, and is ejected upwardly from the ejection nozzles 40.

The ejection nozzles 40 should preferably be designed so as to adjust the kinetic energy of the treatment solution to be ejected toward the substrate W held by the substrate holder 12. With this configuration, it is possible to adjust pressures applied to the surface, to be processed, of the substrate W when the treatment solution is brought into contact with the surface of the substrate W.

As shown in FIG. 2, the substrate processing apparatus 10 has a treatment chamber 46 in the form of an upwardly opened cap. The treatment chamber 46 has a sidewall extending upward and surrounding the nozzle head 42, and a discharge port 46a provided at the bottom thereof. The treatment chamber 46 serves to prevent the treatment solution from being scattered.

Operation of a chemical treatment process or a rinsing process with pure water on the substrate with use of the substrate processing apparatus will be described below.

First, a substrate W is introduced into the interior of the housing 14 of the substrate holder 12, and the peripheral portion of the substrate W is brought into contact with the sealing ring 18 provided on the upper surface of the projecting portion 14a. Thus, the substrate W is placed on the projecting portion 14a in a state such that the surface (to be processed) of the substrate W faces downward. Then, the substrate presser 16 is lowered to sandwich the peripheral portion of the substrate W between the projecting portion 14a and the substrate presser 16 in a state such that the peripheral portion of the surface (lower surface) to be processed is sealed by the sealing ring 18. The substrate holder 12 may be lifted or lowered to a desired position as needed. Thereafter, the substrate holder 12 is lifted and lowered in a certain range and simultaneously rotated.

In this state, the treatment solution such as a chemical solution or pure water is ejected from the ejection nozzles 40 toward the substrate W to perform treatment on the surface, to be processed, of the substrate W with the treatment solution. The treatment solution ejected from the ejection nozzles 40 toward the substrate W flows into the treatment chamber 46 and is discharged from the discharge port 46a to the exterior.

In this manner, the treatment solution, such as a chemical solution or pure water, is ejected from the ejection nozzles 40 toward the substrate W to perform treatment on the surface, to be processed, of the substrate W with the treatment solution, so that a fresh treatment solution is positively supplied to the surface, to be processed, of the substrate W. Thus, the surface, to be processed, of the substrate W is always brought into contact with a fresh treatment solution. Therefore, the surface to be processed is prevented from being recontaminated. Further, contaminants attached to the surface of the substrate and dissolved ions are promoted to be quickly removed from the surface of the substrate to thus perform treatment of the substrate W efficiently in a short time. Furthermore, since the peripheral portion of the surface (lower surface) to be processed is sealed by the sealing ring 18, the reverse side of the substrate W is effectively prevented from being contaminated. While the substrate W is being rotated and vertically moved relative to the ejection nozzles 40, a fresh treatment solution is positively supplied to the surface of the substrate W. As a result, the treatment solution can be supplied uniformly to the entire surface of the substrate W while lessening pressures applied to the surface of the substrate W.

In the present embodiment, the substrate W is rotated and vertically moved relative to the ejection nozzles 40. However, the ejection nozzles 40 may be rotated and vertically moved relative to the substrate W.

After the treatment with the treatment solution for a certain period, the ejection of the treatment solution from the ejection nozzles 40 is stopped, and the vertical movement of the substrate holder 12 is also stopped. Thereafter, the treatment solution attached to the substrate W is removed from the substrate W, and the rotation of the substrate W is stopped. The processed substrate W is transferred to the exterior of the housing 14 in the reverse order of the order described above.

Figure 3:
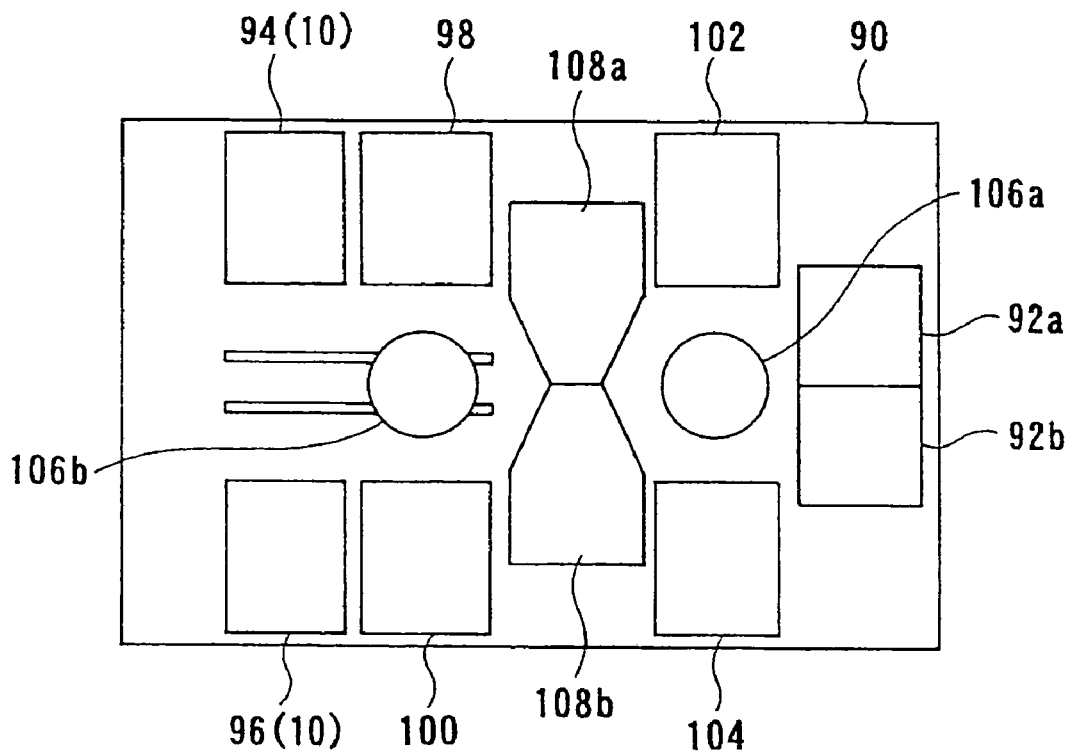
FIG. 3 is a plan view showing a whole arrangement of a plating apparatus for forming a copper interconnection in which the substrate processing apparatus shown in FIG. 2 is utilized as a pretreatment apparatus of an electroless plating process.

FIG. 3 shows a whole arrangement of a plating apparatus in which the aforementioned substrate processing apparatus 10 is utilized as a pretreatment apparatus of an electroless plating process. The plating apparatus serves to form copper interconnections in a substrate such as a semiconductor wafer by filling copper into interconnection grooves or contact holes formed in the surface of the substrate.

The plating apparatus comprises loading/unloading units 92a, 92b, an adsorption processing apparatus 94 (as a pretreatment apparatus of an electroless plating process) for performing an adsorption process with an $SnCl_2$ solution or the like which serves as an adsorbent for Sn, a substitution processing apparatus 96 (as a pretreatment apparatus of an electroless plating process) for performing a substitution process with a $PdCl_2$ solution or the like to substitute Sn for Pd, an electroless plating apparatus 98, an electrolytic plating apparatus 100, a bevel etching apparatus 102 for removing unnecessary copper attached to or deposited on the peripheral portion of the substrate W and cleaning the reverse side of the substrate W as needed, a cleaning and drying apparatus 104 for cleaning and drying the substrate W after the bevel etching process, two transfer devices (transfer robots) 106a, 106b for transferring the substrate W between the above components, and temporary placing tables 108a, 108b. These components are disposed in a housing 90. The adsorption processing apparatus 94 and the substitution processing apparatus 96 serving as a pretreatment apparatus of the electroless plating process have the same structure as the substrate processing apparatus 10 shown in FIG. 2, respectively, but use a different chemical solution from the chemical solution used in the substrate processing apparatus 10 shown in FIG. 2, respectively. In the present embodiment, the cleaning and drying apparatus 104 comprises a spin-drying unit having a pencil type sponge.

A plating process with the plating apparatus thus constructed will be described below. First, the substrate W held by the loading/unloading unit 92a or 92b is taken up by one of the transfer devices 106a and placed on the temporary placing table 108a or 108b. The other transfer device 106b transfers the substrate W to the adsorption processing apparatus 94. While the substrate W is being vertically moved and rotated, the chemical solution containing an adsorbent such as $SnCl_2$ is supplied to the surface, to be processed, of the substrate W to perform an adsorption process of the surface, to be processed, of the substrate W. Sequentially to this chemical treatment process, while the substrate is being vertically moved and rotated, pure water is supplied to the surface of the substrate W to perform a rinsing process for removing the chemical solution attached to the substrate W therefrom with the pure water. Next, the substrate W is transferred to the adjacent substitution processing apparatus 96. In the substitution processing apparatus 96, while the substrate W is being vertically moved and rotated, a Pd substitution processing is performed on the surface of the substrate W with a $PdCl_2$ solution to provide a catalyst to the surface of the substrate W. Sequentially to this chemical treatment process, while the substrate is being vertically moved and rotated, pure water is supplied to the surface of the substrate W to perform a rinsing process for removing the chemical solution attached to the substrate W therefrom with the pure water.

In the above processes, ions $Sn^{2+}$ from $SnCl_2$ are adsorbed into the surface of the substrate W in the Sn adsorption processing apparatus 94. In the substitution processing apparatus 96, the ions $Sn^{2+}$ are oxidized into $Sn^{4+}$, and ions $Pd^{2+}$ are reduced into metal Pd and deposited on the surface of the substrate to serve a catalyst layer in the next electroless plating process. These processes may be performed with the use of a catalyst of one solution of Pd/Sn colloid. The above catalyst providing process can be performed with the Sn adsorption processing apparatus and the Pd substitution processing apparatus, as described above. However, the substrate W may be transferred into the plating apparatus after a catalyst providing process in a different apparatus. The Sn adsorption process and the Pd substitution process may be omitted depending on materials or conditions of surfaces of recesses in the semiconductor substrate.

The transfer device 106b transfers the substrate W to the electroless copper plating apparatus 98. In the electroless copper plating apparatus 98, an electroless plating process is performed with a reducing agent and a plating solution. For example, in the electroless plating process, a thin copper plating film is formed on the surface of the barrier layer of TaN or the like. In this case, electrons produced by decomposition of the reducing agent on a solid-liquid phase boundary are provided to $Cu^{2+}$ via a catalyst on the surface of the substrate, and thus metal Cu is deposited on the catalyst to form the copper plating film. Transition metals such as Fe, Co, Ni, Cu, and Ag may be used as the catalyst, instead of Pd.

Next, the transfer device 106b takes up the substrate W from the electroless plating apparatus 98 after the electroless plating process and transfers it to the electrolytic plating apparatus 100. In the electrolytic plating apparatus 100, the substrate is immersed in an electrolytic plating solution, and a plating voltage is applied between the substrate and the plating solution to perform the electrolytic plating process. With the electrolytic plating process, copper is filled into interconnection grooves and contact holes formed in the surface of the substrate W.

Then, the substrate is placed on the temporary placing table 108a or 108b by the transfer device 106b and transferred to the bevel etching apparatus 102 by the transfer device 106a. In the bevel etching apparatus 102, unnecessary copper attached to or deposited on the peripheral portion of the substrate W is removed, and the reverse side of the substrate W is cleaned as needed.

The substrate W after the bevel etching process is transferred to the cleaning and drying apparatus 104 by the transfer device 106a. In the cleaning and drying apparatus 104, the substrate W is cleaned with a pencil type sponge and dried by spin-drying. Then, the substrate W is returned to the loading/unloading unit 92a or 92b. Thereafter, the substrate W may be transferred to an annealing apparatus or a CMP apparatus.

In the present embodiment, a copper plating film is deposited on the surface of the substrate in the electroless copper plating process. However, the plating film of Ni—B, Ni—P, Co—P, Ni—W—P, Ni—Co—P, Co—W—P, or the like may be deposited on the surface of the substrate in the electroless copper plating process.

Figure 4:
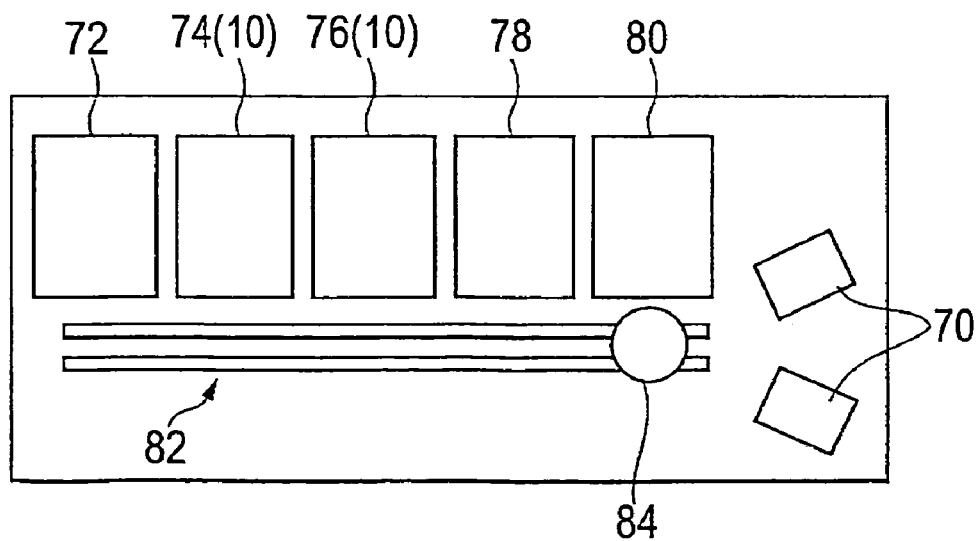
FIG. 4 is a plan view showing a whole arrangement of a plating apparatus for performing a plating process (cap plating process) of forming a protective film in which the substrate processing apparatus shown in FIG. 2 is utilized as a pretreatment apparatus of an electroless plating process.

FIG. 4 shows a whole arrangement of a plating apparatus for performing a plating process (cap plating process) of forming the protective film 9 shown in FIG. 1D. The plating apparatus comprises loading/unloading units 70, a pretreatment apparatus 72, a Pd attaching apparatus 74 (as a pretreatment apparatus of an electroless plating process), a pretreatment apparatus 76 of an electroless plating process, an electroless plating apparatus 78, a cleaning and drying apparatus 80, and a transfer device 84 movable along a transferring line 82 for transferring a substrate between the above components.

A plating process (cap plating process) with the plating apparatus thus constructed will be described below. First, the transfer devices 84 takes up the substrate W held by the loading/unloading unit 70 and transfers the substrate W to the pretreatment apparatus 72. In the pretreatment apparatus 72, a pretreatment process, for example, cleaning the surface of the substrate, is performed on the substrate. Then, in the Pd attaching apparatus 74, Pd is attached to the surface of the copper layer 7 (see FIG. 1C) to activate the exposed surface of the copper layer 7. Thereafter, in the pretreatment apparatus 76 of an electroless plating process, an electroless plating pretreatment process, for example, neutralization, is performed on the substrate. Next, the substrate is transferred to the electroless plating apparatus 78. In the electroless plating apparatus 78, an electroless plating process is performed selectively on the surface of the activated copper layer 7 with Co—W—P, for example, to protect the exposed surface of the copper layer 7 by the Co—W—P film (protective film) 9 as shown in FIG. 1D. The electroless plating solution may comprise a salt of cobalt and a salt of tungsten to which a reducing agent, a complexing agent, a pH buffering agent, and a pH adjusting agent are added.

In the present embodiment, the exposed surface of the copper layer 7 to which Pd is attached is activated and selectively covered with the Co—W—P film 9 before the Co—W—P electroless plating process serving as the cap plating process. However, the present invention is not limited thereto.

As another example, an electroless Ni—B plating process is performed on the exposed surface of the substrate after the polishing process to form the protective film (plated film) 9 of Ni—B alloy selectively on the interconnection 8 for protecting the interconnection 8. The protective film 9 should have a thickness of 0.1 to 500 nm, preferably 1 to 200 nm, and more preferably about 10 to about 100 nm.

For example, an electroless Ni—B plating solution for forming the protective film 9 contains nickel ions, a complexing agent for nickel ions, and an alkylamine borane or a borohydride compound as a reducing agent for nickel ions, for example. Tetramethylammonium hydroxide (TMAH) is used as the pH adjusting agent, and the pH of the electroless Ni—B plating solution is adjusted to be in a range from 5 to 12.

Then, the substrate W after the cap plating process is transferred to the cleaning and drying apparatus 80 to perform the cleaning and drying process. The substrate W after the cleaning and drying process is returned to the loading/unloading unit 70 by the transfer device 84.

Figure 5:
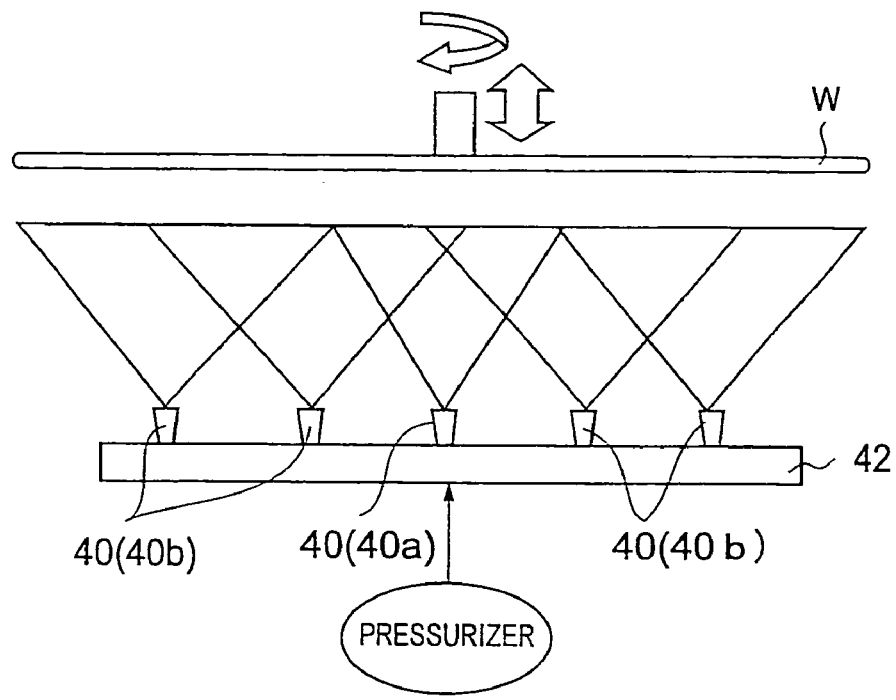
FIG. 5 is a front view showing a nozzle head in a substrate processing apparatus according to another embodiment of the present invention.
Figure 6:
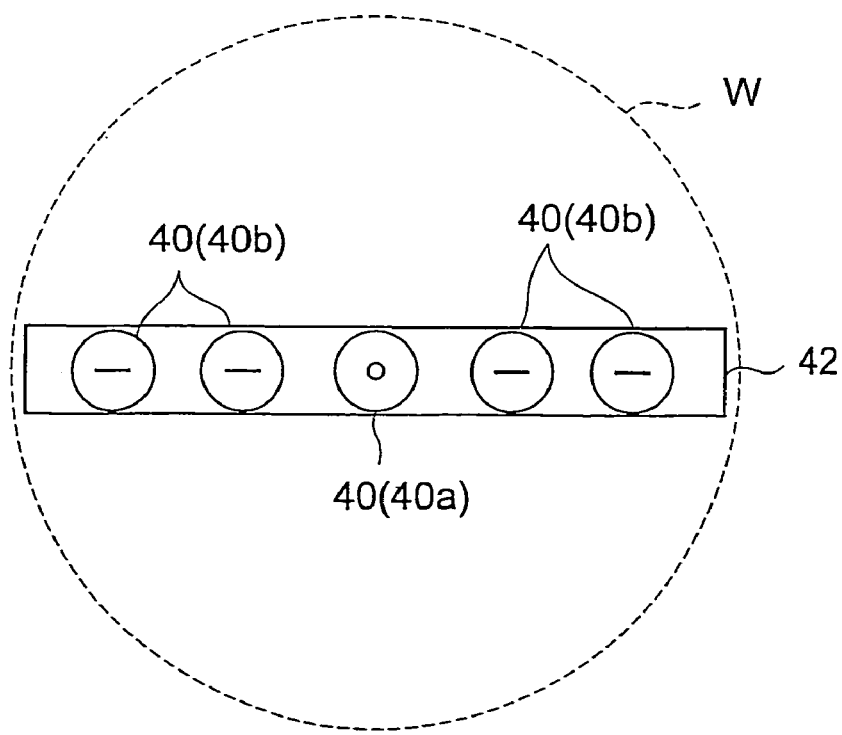
FIG. 6 is a plan view showing the nozzle head shown in FIG. 5.

As shown in FIGS. 5 and 6, in the nozzle head 42 extending linearly along the radial direction of the substrate W held by the substrate holder 12, the ejection nozzles 40 disposed along the longitudinal direction of the nozzle head 42 may comprise a conical nozzle 40a disposed at the central position and fan-shaped nozzles 40b at side positions of the conical nozzle 40a which have openings extending along the longitudinal direction of the nozzle head 42, respectively.

Figure 7A:
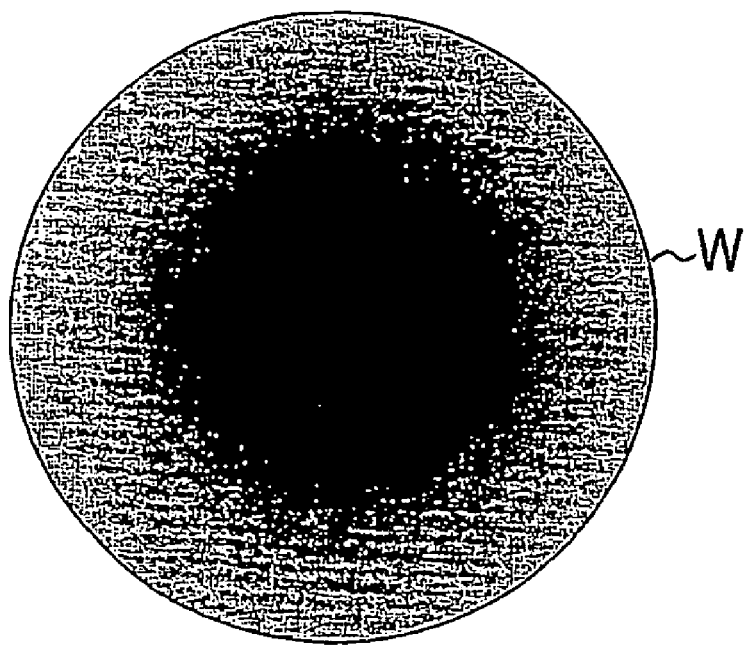
FIG. 7A is an explanatory view of a state of a surface, to be processed, of a substrate in a pretreatment process of an electroless plating process in a case where all of ejection nozzles comprise fan-shaped nozzles in the nozzle head shown in FIG. 5.
Figure 7B:
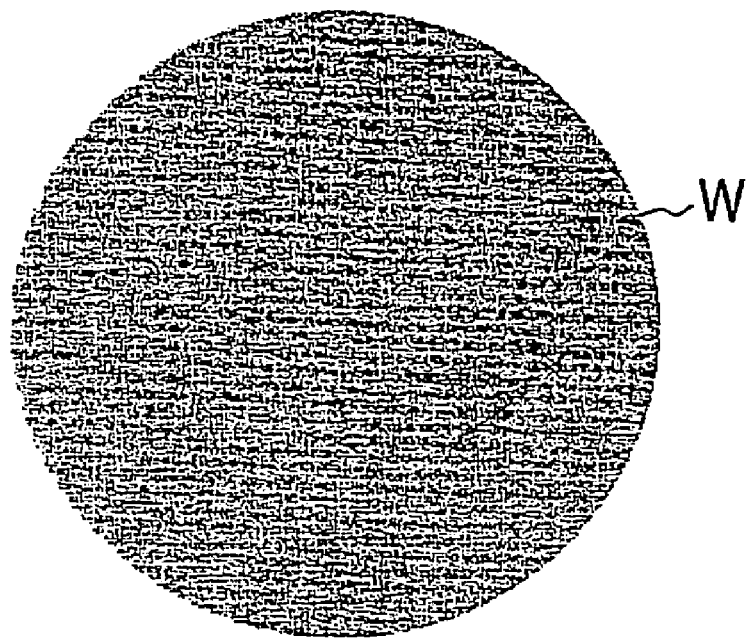
FIG. 7B is an explanatory view of a state of a surface, to be processed, of a substrate in a pretreatment process of an electroless plating process in a case where ejection nozzles comprise a conical nozzle disposed at the central position of the nozzle head shown in FIG. 5 and fan-shaped nozzles at side positions of the conical nozzle.

Since the fan-shaped nozzles 40b are used as the ejection nozzles 40, the treatment solution can be ejected from the fan-shaped nozzles 40b linearly along the radial direction of the substrate W. Therefore, the number of the ejection nozzles 40 can be reduced, and it is possible to adjust pressures to be applied to the surface of the substrate W with a wider range. If all of the ejection nozzles 40 comprise the fan-shaped nozzles 40b and eject the treatment solution toward the substrate W held by the substrate holder 12, then high pressures are continuously applied to the central region of the substrate W, as shown in FIG. 7A, and hence higher pressures are applied to the central region of the surface of the substrate W. When the ejection nozzle 40 disposed at the central position comprises the conical nozzle 40a for applying a relatively lower pressure to a wide region, pressures applied to the central region of the surface of the substrate are lessened, and uniform pressures can be applied to the surface of the substrate W, as shown in FIG. 7B.

Figure 8:
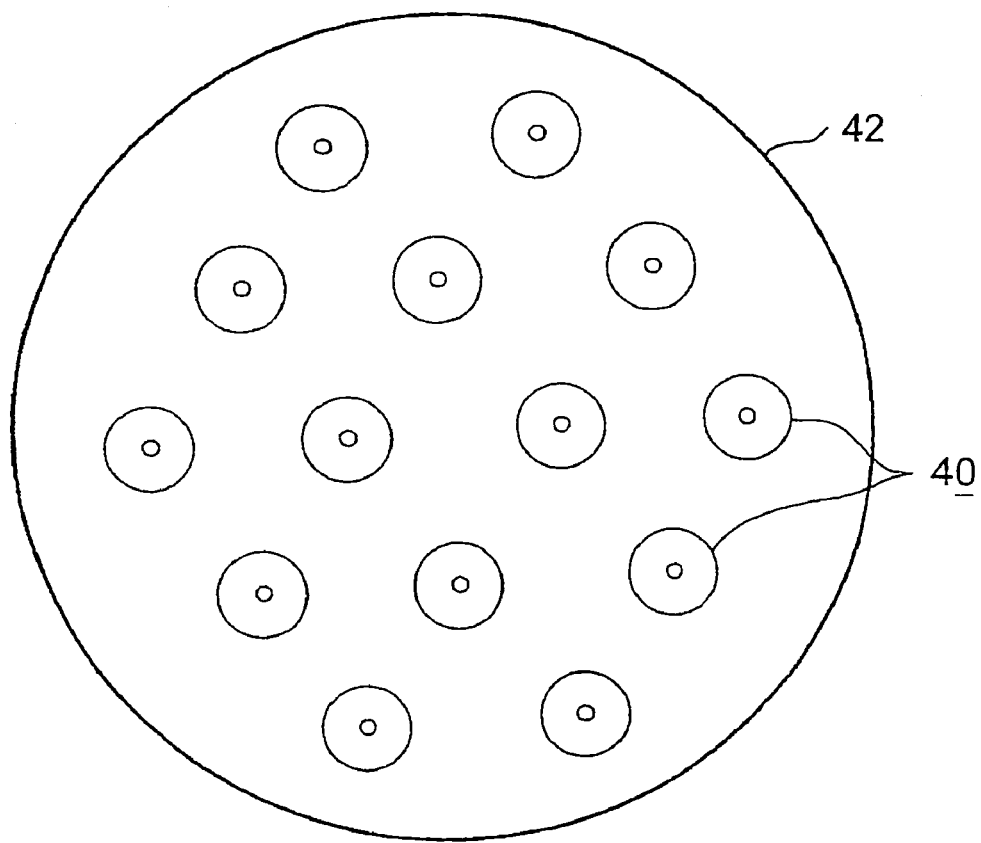
FIG. 8 is a plan view showing a nozzle head in a substrate processing apparatus according to still another embodiment of the present invention.
Figure 9:
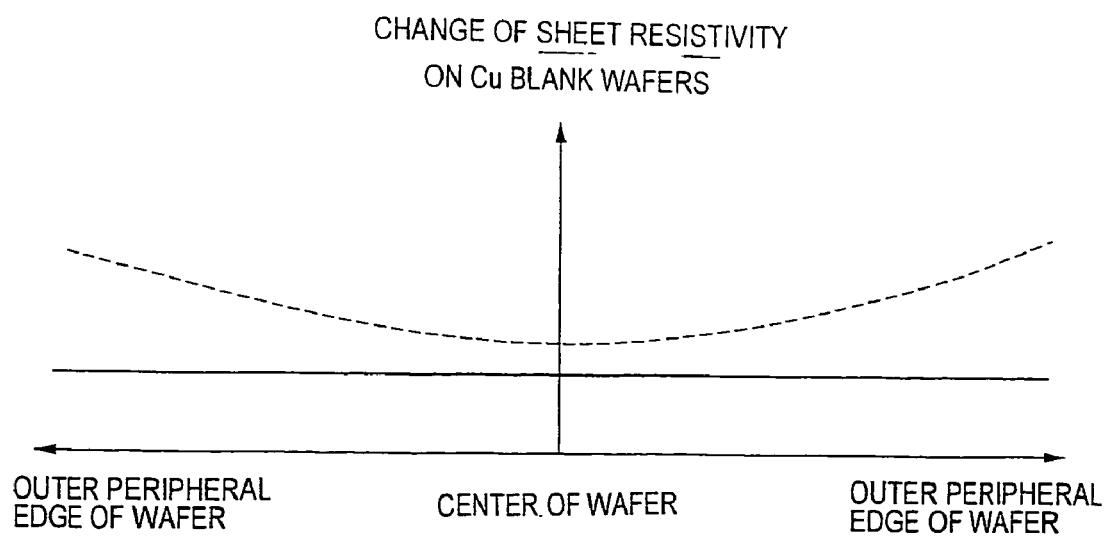
FIG. 9 is a graph showing the sheet resistivity along the entire surface of a substrate (wafer) in a pretreatment process of an electroless plating process, a solid line representing a case where the nozzle head shown in FIG. 8 is used, and a dotted line representing a case where a linearly extending nozzle head is used.

Further, as shown in FIG. 8, the nozzle head 42 may comprise a disk-shaped nozzle head having substantially the same diameter as the substrate W. In this case, the ejection nozzles 40 may be disposed so as to be distributed uniformly over the entire surface of the disk-shaped nozzle head 42. For example, the pretreatment process of the electroless plating process tends to depend on the rotation of the substrate. Therefore, if a linearly extending nozzle head is used as the nozzle head, then the sheet resistivity increases gradually toward the outer peripheral edge of the substrate (wafer) as shown by a dotted line in FIG. 9 when the pretreatment process is performed while the substrate is rotated at a high speed. When the ejection nozzles 40 are disposed uniformly over the entire surface of the substrate, even if the substrate is rotated at a high speed or at a lower speed, or is not rotated, the change of sheet resistivity that shows the spray uniformity can be made uniform over the entire surface of the substrate (wafer) as shown by a solid line in FIG. 9 to thus supply the treatment solution uniformly over the entire surface of the substrate.

Figure 10:
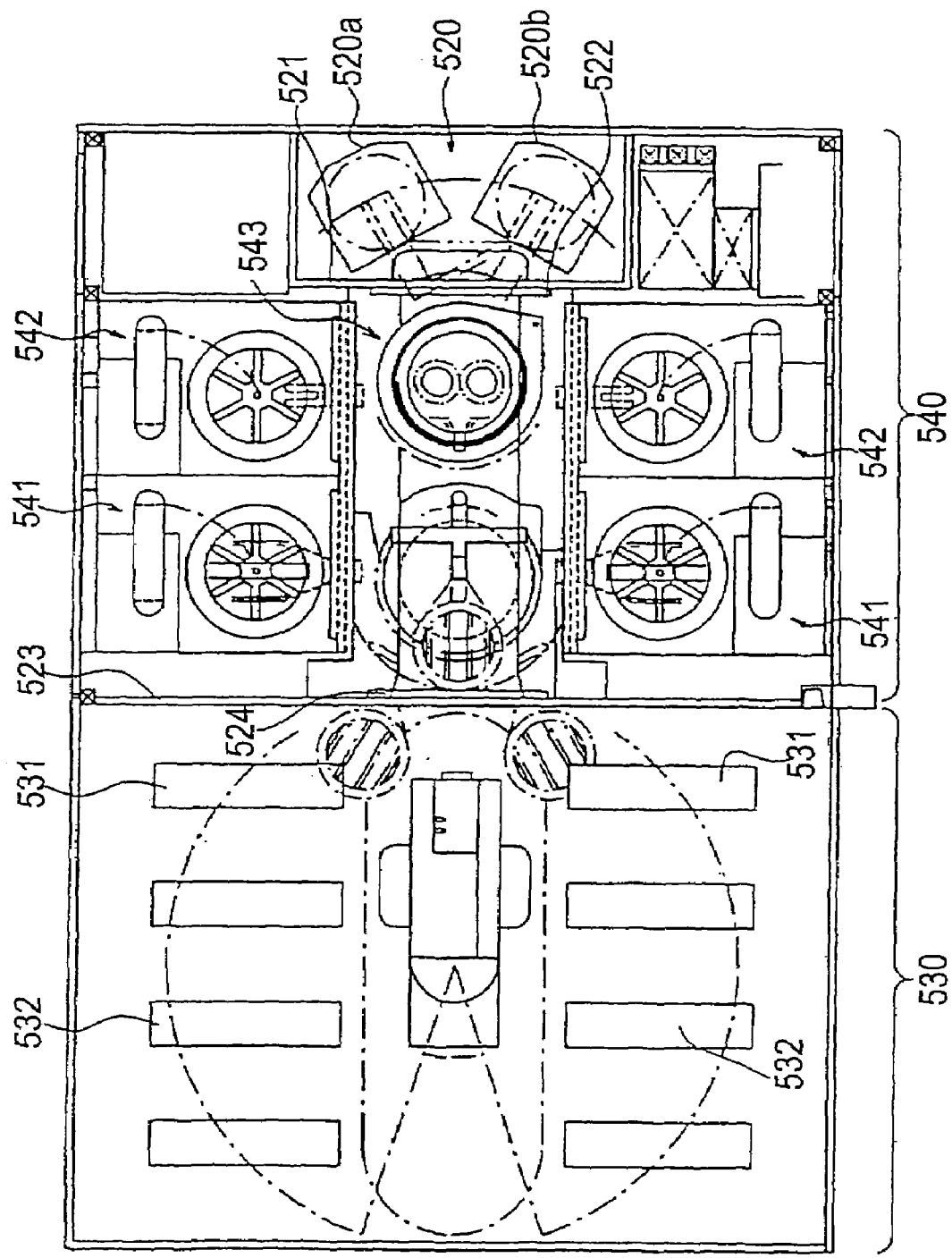
FIG. 10 is a view showing a plan layout constitution of an embodiment of a substrate processing apparatus for forming an interconnections-protective film according to the present invention.

FIG. 10 is a plan view showing a whole arrangement of a substrate processing apparatus for processing a substrate according to an embodiment of the present invention. As shown in FIG. 10, the substrate processing apparatus comprises a loading and unloading area 520 for housing wafer cassettes which accommodate semiconductor substrates, a processing area 530 for processing semiconductor substrates, and a cleaning and drying area 540 for cleaning and drying processed semiconductor substrates. The cleaning and drying area 540 is positioned between the loading and unloading area 520 and the processing area 530. A partition 521 is disposed between the loading and unloading area 520 and the cleaning and drying area 540, and a partition 523 is disposed between the cleaning and drying area 540 and the processing area 530.

The partition 521 has a passage (not shown) defined therein for transferring semiconductor substrates therethrough between the loading and unloading area 520 and the cleaning and drying area 540, and supports a shutter 522 for opening and closing the passage. The partition 523 has a passage (not shown) defined therein for transferring semiconductor substrates therethrough between the cleaning and drying area 540 and the processing area 530, and supports a shutter 524 for opening and closing the passage. The cleaning and drying area 540 and the processing area 530 can independently be supplied with and discharge air.

The substrate processing apparatus is placed in a clean room. The pressures in the loading and unloading area 520, the processing area 530, and the cleaning and drying area 540 are selected as follows.

The pressure in the loading and unloading area 520>the pressure in the cleaning and drying area 540>the pressure in the processing area 530.

The pressure in the loading and unloading area 520 is lower than the pressure in the clean room. Therefore, air does not flow from the processing area 530 into the cleaning and drying area 540, and air does not flow from the cleaning and drying area 540 into the loading and unloading area 520. Furthermore, air does not flow from the loading and unloading area 520 into the clean room.

The loading and unloading area 520 houses a loading unit 520a and an unloading unit 520b, each accommodating a wafer cassette for storing semiconductor substrates. The cleaning and drying area 540 houses two water cleaning units 541 for processing plated semiconductor substrates, two drying units 542, and a transfer unit (transfer robot) 543 for transferring the substrates. Each of the water cleaning units 541 may comprise a pencil-shaped cleaner with a sponge layer mounted on a front end thereof or a roller with a sponge layer mounted on an outer circumferential surface thereof. Each of the drying units 542 may comprise a drier for spinning a semiconductor substrate at a high speed to dehydrate and dry.

The processing area 530 houses a plurality of pretreatment chambers 531 for pretreating semiconductor substrates prior to being plated, and a plurality of plating chambers (plating apparatus) 532 for plating semiconductor substrates with copper. The processing area 530 also has a transfer unit (transfer robot) 533 for transferring semiconductor substrates.

Figure 11:
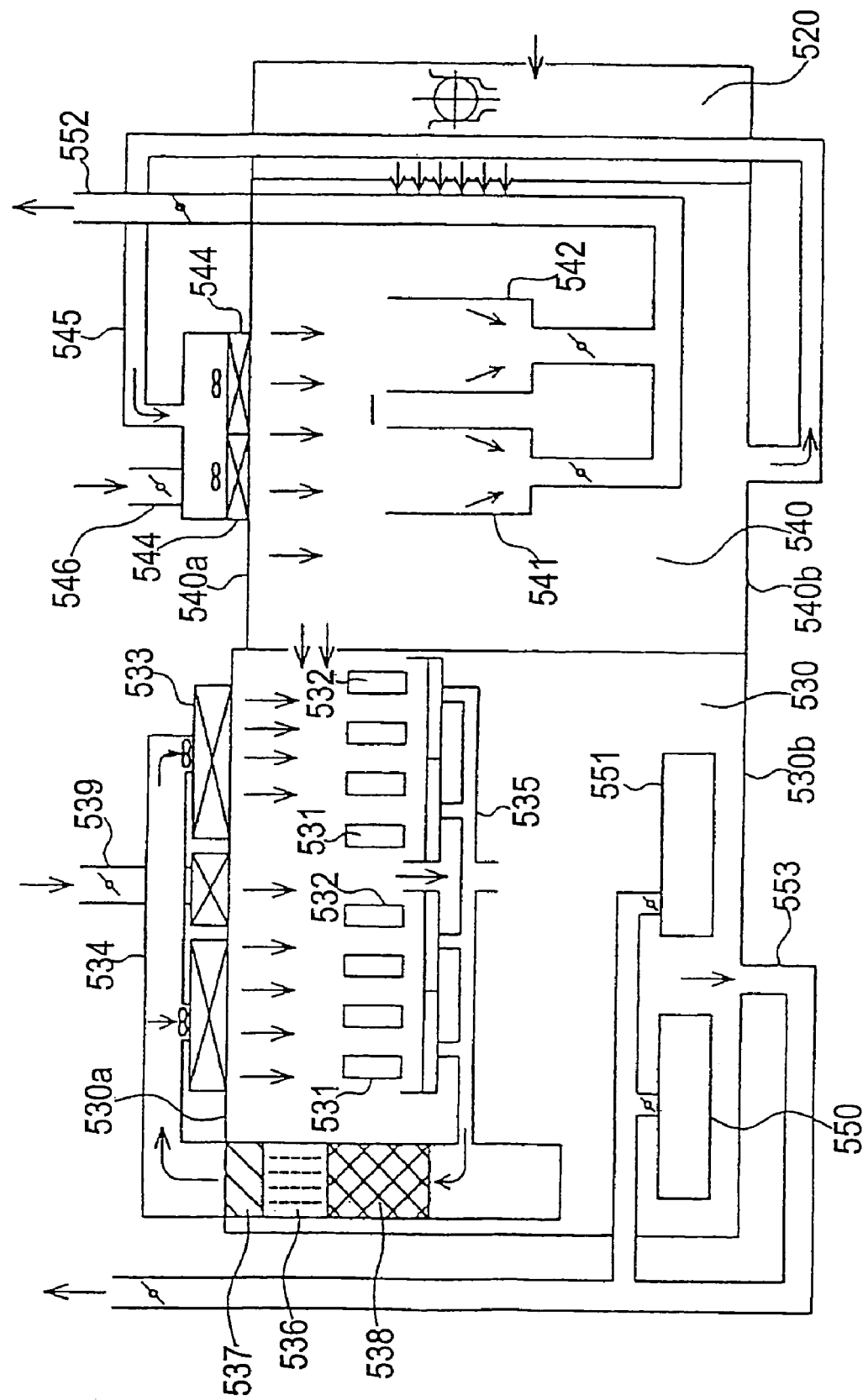
FIG. 11 is a view showing airflow in the substrate processing apparatus shown in FIG. 10.

FIG. 11 shows air flows in the substrate processing apparatus. In the cleaning and drying area 540, fresh air is introduced from the exterior through a duct 546 and forced through high-performance filters 544 by fans from a ceiling 540a into the cleaning and drying area 540 as downward clean air flows around the water cleaning units 541 and the drying units 542. Most of the supplied clean air is returned from a floor 540b through a circulation duct 545 to the ceiling 540a, from which the clean air is forced again through the filters 544 by the fans into the cleaning and drying area 540. Part of the clean air is discharged from the wafer cleaning units 541 and the drying units 542 through a duct 552 out of the cleaning and drying area 540.

In the processing area 530, particles are not allowed to be applied to the surfaces of semiconductor substrates even though the processing area 530 is a wet zone. To prevent particles from being applied to semiconductor substrates, air is forced through high-performance filters 533 by fans from a ceiling 530a into the processing area 530 so as to form downward clean air flows.

If the entire amount of clean air as downward clean air flows introduced into the processing area 530 were always supplied from the exterior, then a large amount of air would be required to be introduced into and discharged from the processing area 530 at all times. Accordingly, air is discharged from the processing area 530 through a duct 553 at a rate sufficient enough to keep the pressure in the processing area 530 lower than the pressure in the cleaning and drying area 540, and most of the downward clean air introduced into the processing area 530 is circulated through circulation ducts 534, 535.

The clean air that has passed through the processing area 530 contains a chemical mist and gases, if circulation air is employed. The chemical mist and gases are removed from the circulating air by a scrubber 536 and mist separators 537, 538. The air returned into the circulation duct 534 over the ceiling 530a is free of any chemical mist and gases. The clean air is then forced through the filters 533 by the fans to circulate back into the processing area 530.

Part of the air is discharged from the processing area 530 through the duct 553 connected to a floor 530b of the processing area 530. Air containing a chemical mist and gases is also discharged from the processing area 530, through the duct 553. The amount of fresh air, which corresponds to the discharged air, is introduced from the exterior through a duct 539 of the ceiling 530a into the processing area 530 so as to maintain the pressure in the processing area 530 lower than the pressure in the cleaning and drying area 540.

Figure 13:
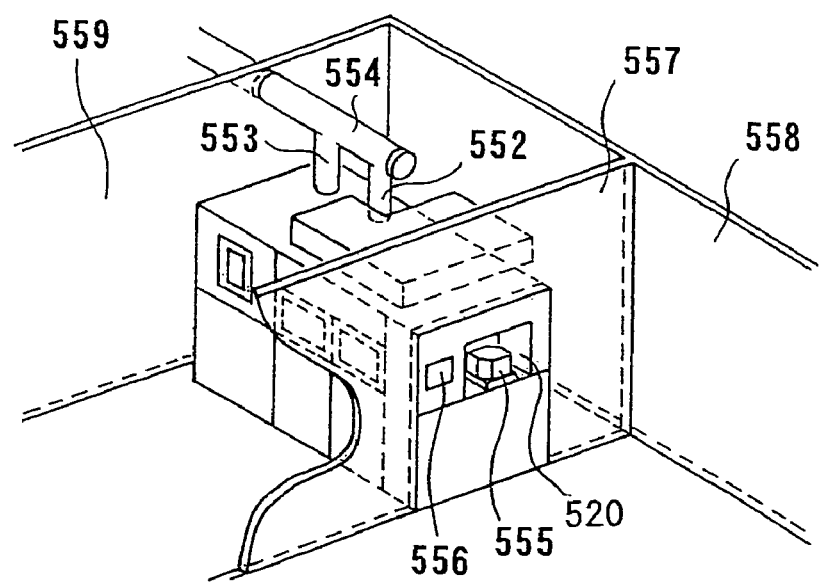
FIG. 13 is a perspective view of the substrate processing apparatus shown in FIG. 10, which is placed in a clean room.

As described above, the pressure in the loading and unloading area 520 is higher than the pressure in the cleaning and drying area 540 which is higher than the pressure in the processing area 530. When the shutters 522, 524 (see FIG. 10) are opened, therefore, air flows successively through the loading and unloading area 520, the cleaning and drying area 540, and the processing area 530. Air discharged flows through the ducts 552, 553 into a common duct 554, as shown in FIG. 13.

Figure 12:
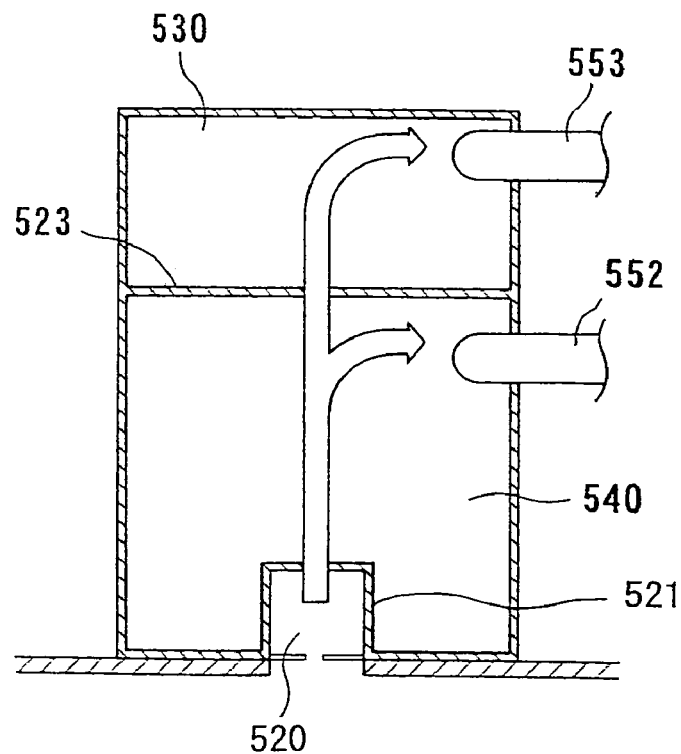
FIG. 12 is a view showing airflows among areas in the substrate processing apparatus shown in FIG. 10.

FIG. 12 shows in perspective the substrate processing apparatus, which is placed in the clean room. The loading and unloading area 520 includes a side wall which has a cassette transfer port 555 defined therein and a control panel 556, and which is exposed to a working zone 558 that is compartmented in the clean room by a partition wall 557. Other sidewalls of the substrate processing apparatus are exposed to the utility zone 559 whose air cleanliness is lower than the air cleanliness in the working zone 558.

As described above, the cleaning and drying area 540 is disposed between the loading and unloading area 520 and the processing area 530. The partition 521 is disposed between the loading and unloading area 520 and the cleaning and drying area 540. The partition 521 is disposed between the cleaning and drying area 540 and the processing area 530. A dry semiconductor substrate is loaded from the working zone 558 through the cassette transfer port 555 into the substrate processing apparatus, and then plated in the substrate processing apparatus. The plated semiconductor substrate is cleaned and dried, and then unloaded from the substrate processing apparatus through the cassette transfer port 555 into the working zone 558. Consequently, no particles and mist are applied to the surface of the semiconductor substrate, and the working zone 558 which has higher air cleanness than the utility zone 557 is prevented from being contaminated by particles, chemical mists, and cleaning solution mists.

In the example shown in FIGS. 10 and 11, the substrate processing apparatus has the loading and unloading area 520, the cleaning and drying area 540, and the processing area 530. However, an area accommodating a chemical mechanical polishing unit may be disposed in or adjacent to the processing area 530, and the cleaning and drying area 540 may be disposed in the processing area 530 or between the area accommodating the chemical mechanical polishing unit and the loading and unloading area 520. Any of various other suitable area and unit layouts may be employed insofar as a dry state semiconductor substrate can be loaded into the substrate processing apparatus, and a plated semiconductor substrate can be cleaned and dried, and thereafter unloaded from the substrate processing apparatus.

Figure 14:
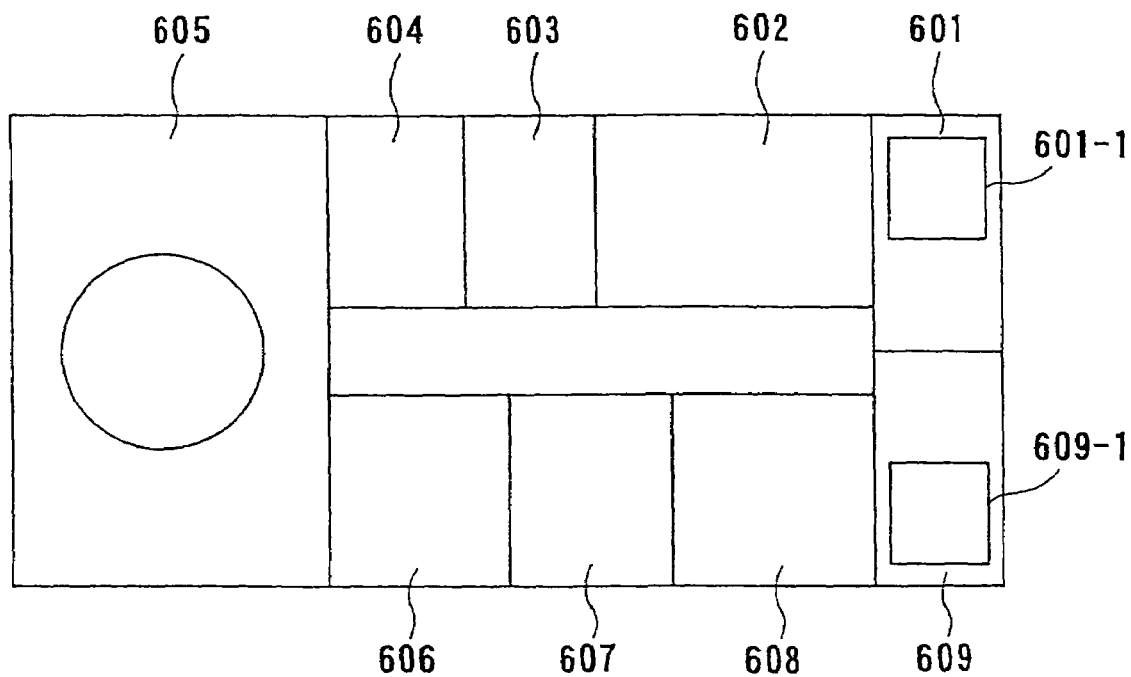
FIG. 14 is a plan view of another example of a substrate processing apparatus.

FIG. 14 is a plan view of another example of a substrate processing apparatus. The substrate processing apparatus shown in FIG. 14 comprises a loading unit 601 for loading a semiconductor substrate, a copper plating chamber 602 for plating a semiconductor substrate with copper, a pair of water cleaning chambers 603, 604 for cleaning a semiconductor substrate with water, a chemical mechanical polishing unit 605 for chemically and mechanically polishing a semiconductor substrate, a pair of water cleaning chambers 606, 607 for cleaning a semiconductor substrate with water, a drying chamber 608 for drying a semiconductor substrate, and an unloading unit 609 for unloading a semiconductor substrate with an interconnection film thereon. The substrate processing apparatus also has a substrate transfer mechanism (not shown) for transferring semiconductor substrates to the chambers 602, 603, 604, the chemical mechanical polishing unit 605, the chambers 606, 607, 608, and the unloading unit 609. The loading unit 601, the chambers 602, 603, 604, the chemical mechanical polishing unit 605, the chambers 606, 607, 608, and the unloading unit 609 are combined into a single unitary arrangement as an apparatus.

The substrate processing apparatus operates as follows. The substrate transfer mechanism transfers a semiconductor substrate on which an interconnection film has not yet been formed from a substrate cassette 601-1 placed in the loading unit 601 to the copper plating chamber 602. In the copper plating chamber 602, a plated copper film is formed on a surface of the semiconductor substrate W having an interconnection region composed of an interconnection trench and an interconnection hole (contact hole).

After the plated copper film is formed on the semiconductor substrate W in the copper plating chamber 602, the semiconductor substrate W is transferred to one of the water cleaning chambers 603, 604 by the substrate transfer mechanism and cleaned by water in one of the water cleaning chambers 603, 604. The cleaned semiconductor substrate W is transferred to the chemical mechanical polishing unit 605 by the substrate transfer mechanism. The chemical mechanical polishing unit 605 removes the unwanted plated copper film from the surface of the semiconductor substrate W, leaving a portion of the plated copper film in the interconnection trench and the interconnection hole.

Then, the semiconductor substrate W with the remaining plated copper film is transferred to one of the water cleaning chambers 606, 607 by the substrate transfer mechanism and cleaned by water in one of the water cleaning chambers 606, 607. The cleaned semiconductor substrate W is then dried in the drying chamber 608, after which the dried semiconductor substrate W with the remaining plated copper film serving as an interconnection film is placed into a substrate cassette 609-1 in the unloading unit 609.

Figure 15:
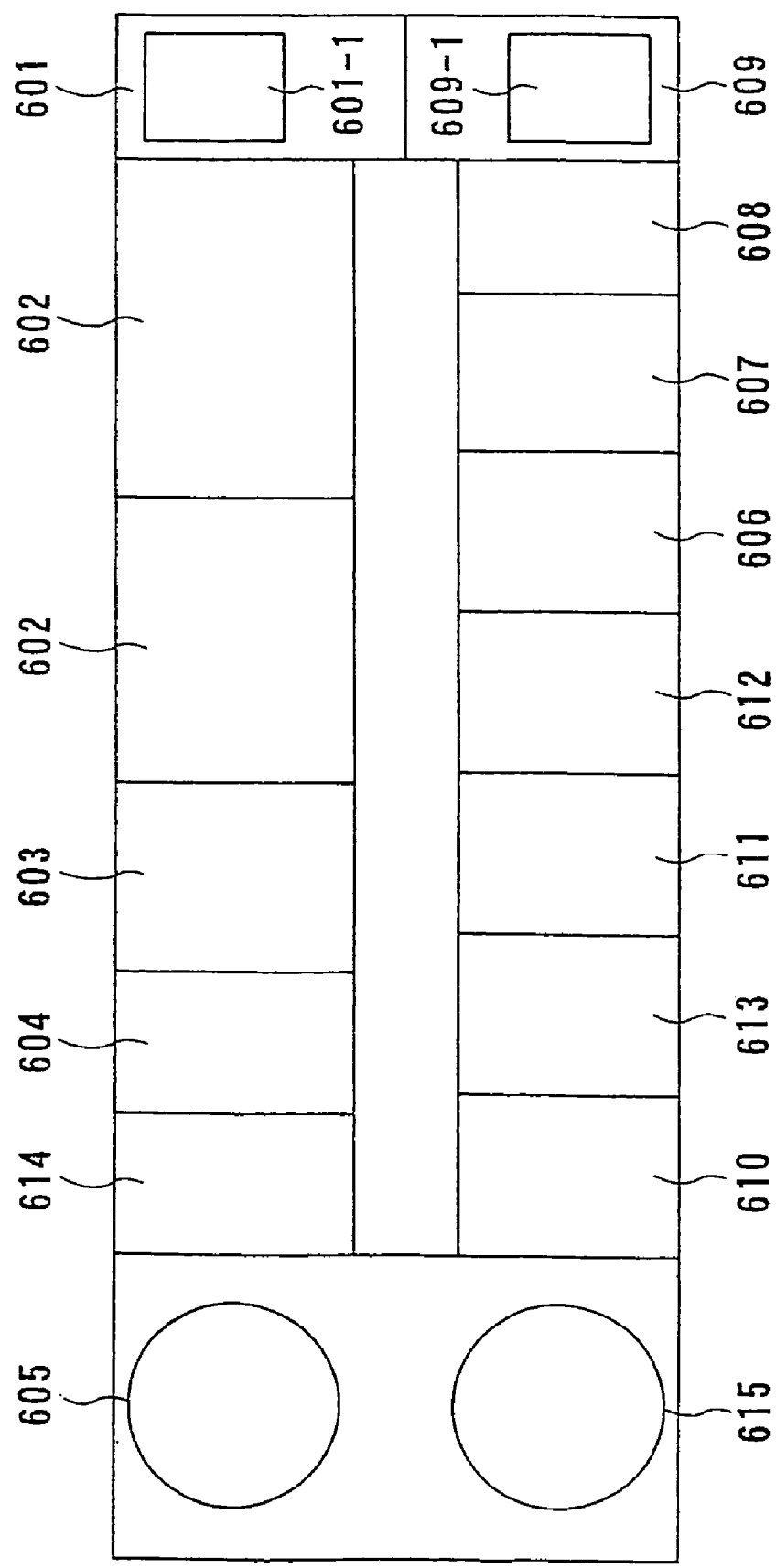
FIG. 15 is a plan view of still another example of a substrate processing apparatus.

FIG. 15 shows a plan view of still another example of a substrate processing apparatus. The substrate processing apparatus shown in FIG. 15 differs from the substrate processing apparatus shown in FIG. 14 in that it additionally includes a copper plating chamber 602, a water cleaning chamber 610, a pretreatment chamber 611, a cap plating chamber 612 for forming a protective plated layer on a plated copper film on a semiconductor substrate, water cleaning chambers 613, 614, and a chemical mechanical polishing unit 615. The loading unit 601, the chambers 602, 602, 603, 604, 614, the chemical mechanical polishing unit 605, 615, the chambers 606, 607, 608, 610, 611, 612, 613, and the unloading unit 609 are combined into a single unitary arrangement as an apparatus.

The substrate processing apparatus shown in FIG. 15 operates as follows. A semiconductor substrate W is supplied from the substrate cassette 601-1 placed in the loading unit 601 successively to one of the copper plating chambers 602, 602. In one of the copper plating chamber 602, 602, a plated copper film is formed on a surface of a semiconductor substrate W having an interconnection region composed of an interconnection trench and an interconnection hole (contact hole). The two copper plating chambers 602, 602 are employed to allow the semiconductor substrate W to be plated with a copper film for a long period of time. Specifically, the semiconductor substrate W may be plated with a primary copper film according to electroless plating in one of the copper plating chamber 602, and then plated with a secondary copper film according to electroplating in the other copper plating chamber 602. The substrate plating apparatus may have more than two copper plating chambers.

The semiconductor substrate W with the plated copper film formed thereon is cleaned by water in one of the water cleaning chambers 603, 604. Then, the chemical mechanical polishing unit 605 removes the unwanted portion of the plated copper film from the surface of the semiconductor substrate W, leaving a portion of the plated copper film in the interconnection trench and the interconnection hole.

Thereafter, the semiconductor substrate W with the remaining plated copper film is transferred to the water cleaning chamber 610, in which the semiconductor substrate W is cleaned with water. Then, the semiconductor substrate W is transferred to the pretreatment chamber 611, and pretreated therein for the deposition (cap plating) of a protective plated layer. The pretreated semiconductor substrate W is transferred to the cap plating chamber 612. In the cap plating chamber 612, a protective plated layer is formed on the plated copper film in the interconnection region on the semiconductor substrate W. For example, the protective plated layer is formed with an alloy of nickel (Ni) and boron (B) by electroless plating. After the protective plated layer is formed on the plated copper film, the semiconductor substrate is cleaned in one of the water cleaning chambers 606, 607 and dried in the drying chamber 608.

Then, an upper portion of the protective plated layer deposited on the plated copper film is polished off to planarize the protective plated layer, in the chemical mechanical polishing unit 615. After the protective plated layer is polished, the semiconductor substrate W is cleaned by water in one of the water cleaning chambers 613, 614, dried in the drying chamber 608, and then transferred to the substrate cassette 609-1 in the unloading unit 609.

Figure 16:
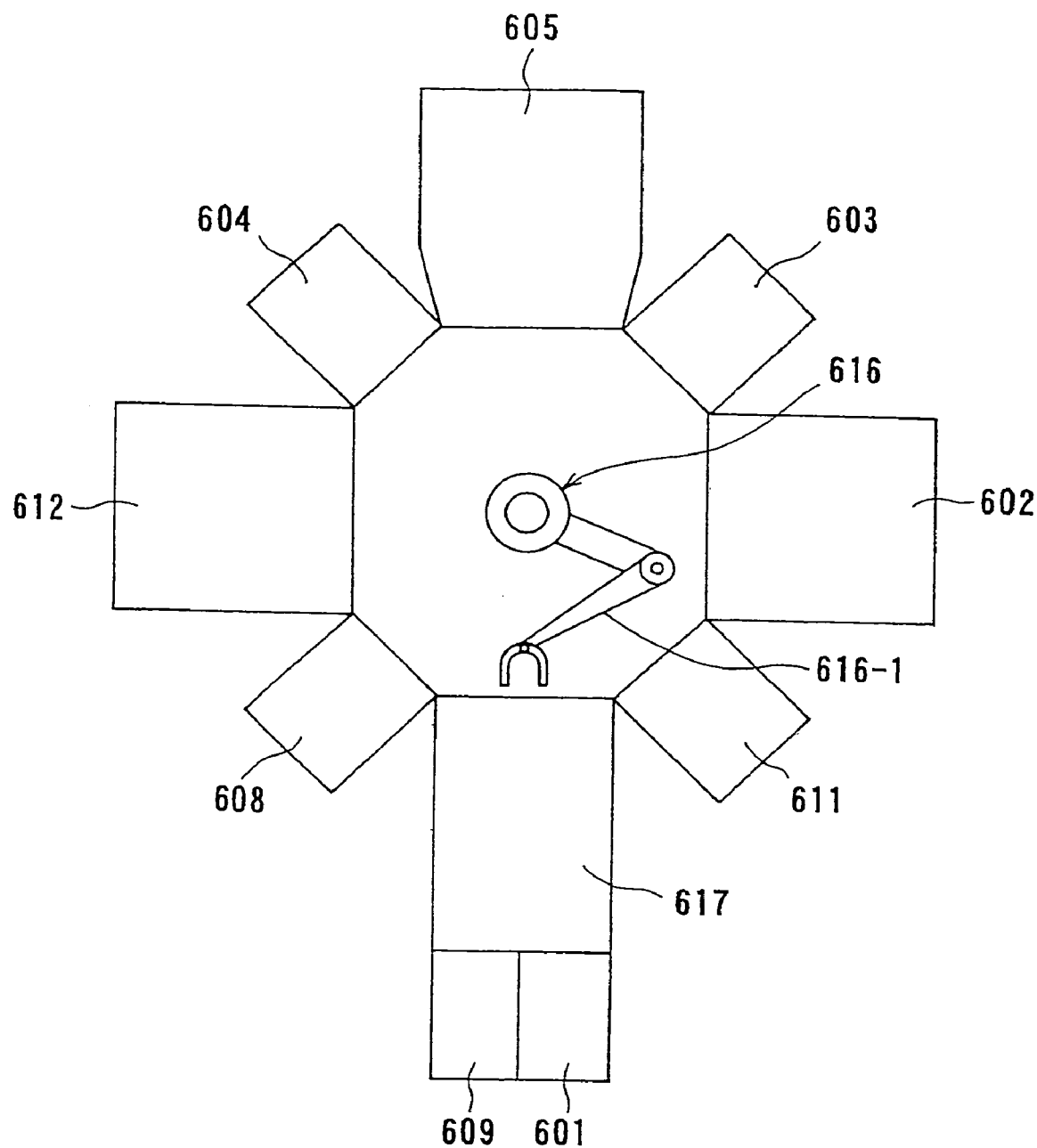
FIG. 16 is a plan view of still another example of a substrate processing apparatus.

FIG. 16 is a plan view of still another example of a substrate processing apparatus. As shown in FIG. 16, the substrate processing apparatus includes a robot 616 at its center which has a robot arm 616-1, and also has a copper plating chamber 602, a pair of water cleaning chambers 603, 604, a chemical mechanical polishing unit 605, a pretreatment chamber 611, a cap plating chamber 612, a drying chamber 608, and a loading/unloading unit 617 which are disposed around the robot 616 and positioned within the reach of the robot arm 616-1. A loading unit 601 for loading semiconductor substrates and an unloading unit 609 for unloading semiconductor substrates are disposed adjacent to the loading/unloading unit 617. The robot 616, the chambers 602, 603, 604, the chemical mechanical polishing unit 605, the chambers 608, 611, 612, the loading/unloading unit 617, the loading unit 601, and the unloading unit 609 are combined into a single unitary arrangement as an apparatus.

The substrate processing apparatus shown in FIG. 16 operates as follows.

A semiconductor substrate to be plated is transferred from the loading unit 601 to the loading/unloading unit 617, from which the semiconductor substrate is received by the robot arm 616-1 and transferred thereby to the copper plating chamber 602. In the copper plating chamber 602, a plated copper film is formed on a surface of the semiconductor substrate which has an interconnection region composed of an interconnection trench and an interconnection hole. The semiconductor substrate with the plated copper film formed thereon is transferred by the robot arm 616-1 to the chemical mechanical polishing unit 605. In the chemical mechanical polishing unit 605, the plated copper film is removed from the surface of the semiconductor substrate W, leaving a portion of the plated copper film in the interconnection trench and the interconnection hole.

The semiconductor substrate is then transferred by the robot arm 616-1 to the water-cleaning chamber 604, in which the semiconductor substrate is cleaned by water. Thereafter, the semiconductor substrate is transferred by the robot arm 616-1 to the pretreatment chamber 611, in which the semiconductor substrate is pretreated therein for the deposition of a protective plated layer. The pretreated semiconductor substrate is transferred by the robot arm 616-1 to the cap plating chamber 612. In the cap plating chamber 612, a protective plated layer is formed on the plated copper film in the interconnection region on the semiconductor substrate W. The semiconductor substrate with the protective plated layer formed thereon is transferred by the robot arm 616-1 to the water cleaning chamber 604, in which the semiconductor substrate is cleaned by water. The cleaned semiconductor substrate is transferred by the robot arm 616-1 to the drying chamber 608, in which the semiconductor substrate is dried. The dried semiconductor substrate is transferred by the robot arm 616-1 to the loading/unloading unit 617, from which the plated semiconductor substrate is transferred to the unloading unit 609.

Figure 17:
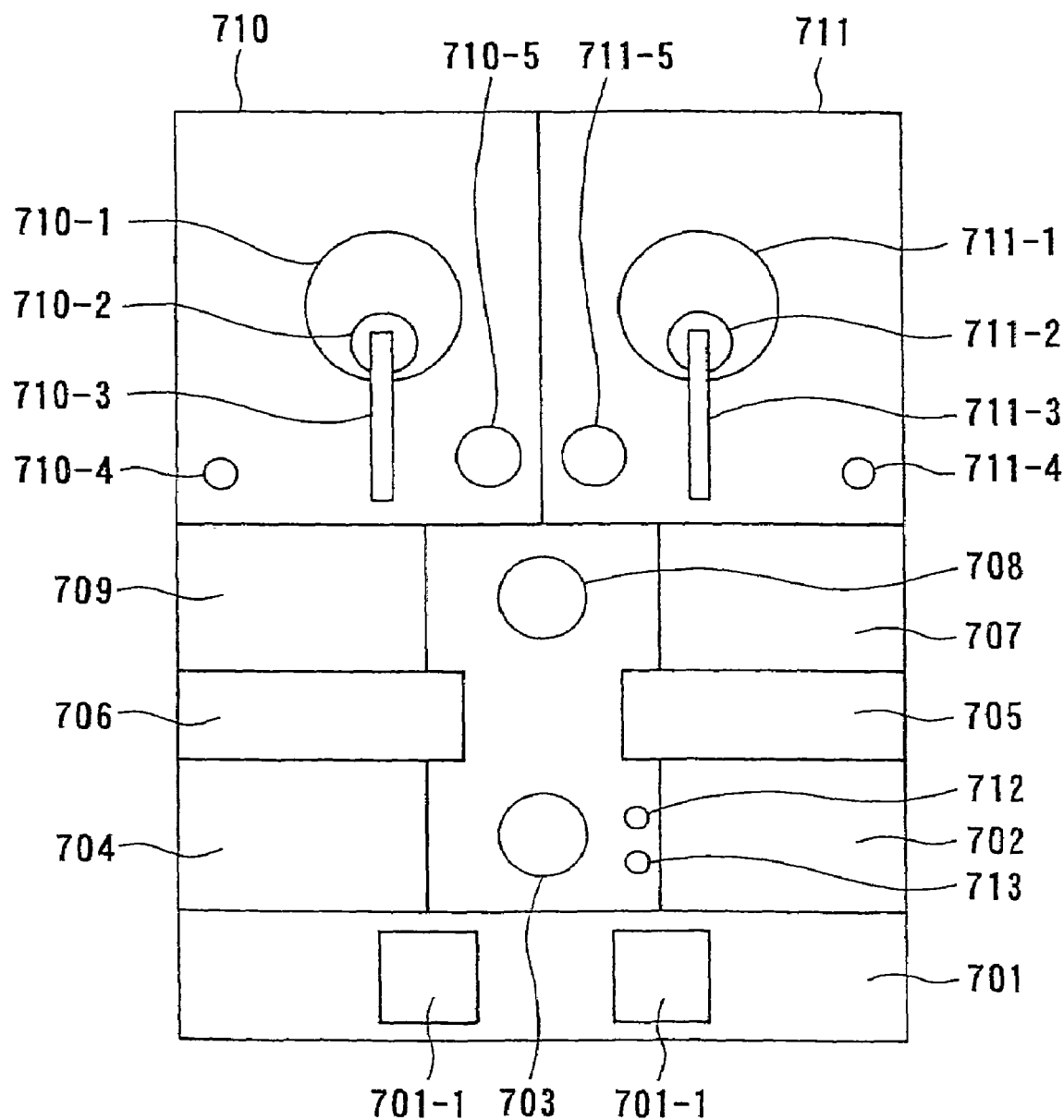
FIG. 17 is a view showing a plan constitution example of the semiconductor substrate processing apparatus.

FIG. 17 is a view showing the plan constitution of another example of a semiconductor substrate processing apparatus. The semiconductor substrate processing apparatus is of a constitution in which there are provided a loading/unloading unit 701, a plated Cu film forming unit 702, a first robot 703, a third cleaning machine 704, a reversing machine 705, a reversing machine 706, a second cleaning machine 707, a second robot 708, a first cleaning machine 709, a first polishing apparatus 710, and a second polishing apparatus 711. A before-plating and after-plating film thickness measuring instrument 712 for measuring the film thicknesses before and after plating, and a dry state film thickness measuring instrument 713 for measuring the film thickness of a semiconductor substrate W in a dry state after polishing are placed near the first robot 703.

The first polishing apparatus (polishing unit) 710 has a polishing table 710-1, a top ring 710-2, a top ring head 710-3, a film thickness measuring instrument 710-4, and a pusher 710-5. The second polishing apparatus (polishing unit) 711 has a polishing table 711-1, a top ring 711-2, a top ring head 711-3, a film thickness measuring instrument 711-4, and a pusher 711-5.

A cassette 701-1 accommodating the semiconductor substrates W, in which a via hole and a trench for interconnect are formed, and a seed layer is formed thereon is placed on a loading port of the loading/unloading unit 701. The first robot 703 takes out the semiconductor substrate W from the cassette 701-1, and carries the semiconductor substrate W into the plated Cu film forming unit 702 where a plated Cu film is formed. At this time, the film thickness of the seed layer is measured with the before-plating and after-plating film thickness measuring instrument 712. The plated Cu film is formed by carrying out hydrophilic treatment of the face of the semiconductor substrate W, and then Cu plating. After formation of the plated Cu film, rinsing or cleaning of the semiconductor substrate W is carried out in the plated Cu film forming unit 702.

When the semiconductor substrate W is taken out from the plated Cu film forming unit 702 by the first robot 703, the film thickness of the plated Cu film is measured with the before-plating and after-plating film thickness measuring instrument 712. The results of its measurement are recorded into a recording device (not shown) as record data on the semiconductor substrate, and are used for judgment of an abnormality of the plated Cu film forming unit 702. After measurement of the film thickness, the first robot 703 transfers the semiconductor substrate W to the reversing machine 705, and the reversing machine 705 reverses the semiconductor substrate W (the surface on which the plated Cu film has been formed faces downward). The first polishing apparatus 710 and the second polishing apparatus 711 perform polishing in a serial mode and a parallel mode. Next, polishing in the serial mode will be described.

In the serial mode polishing, a primary polishing is performed by the polishing apparatus 710, and a secondary polishing is performed by the polishing apparatus 711. The second robot 708 picks up the semiconductor substrate W on the reversing machine 705, and places the semiconductor substrate W on the pusher 710-5 of the polishing apparatus 710. The top ring 710-2 attracts the semiconductor substrate W on the pusher 710-5 by suction, and brings the surface of the plated Cu film of the semiconductor substrate W into contact with a polishing surface of the polishing table 710-1 under pressure to perform a primary polishing. With the primary polishing, the plated Cu film is basically polished. The polishing surface of the polishing table 710-1 is composed of foamed polyurethane such as IC1000, or a material having abrasive grains fixed thereto or impregnated therein. Upon relative movements of the polishing surface and the semiconductor substrate W, the plated Cu film is polished.

After completion of polishing of the plated Cu film, the semiconductor substrate W is returned onto the pusher 710-5 by the top ring 710-2. The second robot 708 picks up the semiconductor substrate W, and introduces it into the first cleaning machine 709. At this time, a chemical liquid may be ejected toward the face and backside of the semiconductor substrate W on the pusher 710-5 to remove particles therefrom or cause particles to be difficult to adhere thereto.

After completion of cleaning in the first cleaning machine 709, the second robot 708 picks up the semiconductor substrate W, and places the semiconductor substrate W on the pusher 711-5 of the second polishing apparatus 711. The top ring 711-2 attracts the semiconductor substrate W on the pusher 711-5 by suction, and brings the surface of the semiconductor substrate W, which has the barrier layer formed thereon, into contact with a polishing surface of the polishing table 711-1 under pressure to perform the secondary polishing. The constitution of the polishing table is the same as the top ring 711-2. With this secondary polishing, the barrier layer is polished. However, there may be a case in which a Cu film and an oxide film left after the primary polishing are also polished.

A polishing surface of the polishing table 711-1 is composed of foamed polyurethane such as IC1000, or a material having abrasive grains fixed thereto or impregnated therein. Upon relative movements of the polishing surface and the semiconductor substrate W, polishing is carried out. At this time, silica, alumina, ceria, or the like is used as abrasive grains or slurry. A chemical liquid is adjusted depending on the type of the film to be polished.

Detection of an end point of the secondary polishing is performed by measuring the film thickness of the barrier layer mainly with the use of the optical film thickness measuring instrument, and detecting the film thickness which has become zero, or the surface of an insulating film comprising $SiO_2$ shows up. Furthermore, a film thickness measuring instrument with an image processing function is used as the film thickness measuring instrument 711-4 provided near the polishing table 711-1. By use of this measuring instrument, measurement of the oxide film is made, the results are stored as processing records of the semiconductor substrate W, and used for judging whether the semiconductor substrate W in which secondary polishing has been finished can be transferred to a subsequent step or not. If the end point of the secondary polishing is not reached, re-polishing is performed. If over-polishing has been performed beyond a prescribed value due to any abnormality, then the semiconductor substrate processing apparatus is stopped to avoid the next polishing so that defective products will not increase.

After completion of the secondary polishing, the semiconductor substrate W is moved to the pusher 711-5 by the top ring 711-2. The second robot 708 picks up the semiconductor substrate W on the pusher 711-5. At this time, a chemical liquid may be ejected toward the face and backside of the semiconductor substrate W on the pusher 711-5 to remove particles therefrom or cause particles to be difficult to adhere thereto.

The second robot 708 carries the semiconductor substrate W into the second cleaning machine 707 where cleaning of the semiconductor substrate W is performed. The constitution of the second cleaning machine 707 is also the same as the constitution of the first cleaning machine 709. The surface of the semiconductor substrate W is scrubbed with the PVA sponge rolls using a cleaning liquid comprising pure water to which a surface active agent, a chelating agent, or a pH regulating agent is added. A strong chemical liquid such as DHF is ejected from a nozzle toward the backside of the semiconductor substrate W to perform etching of the diffused Cu thereon. If there is no problem of diffusion, scrubbing cleaning is performed with the PVA sponge rolls using the same chemical liquid as that used for the surface.

After completion of the above cleaning, the second robot 708 picks up the semiconductor substrate W and transfers it to the reversing machine 706, and the reversing machine 706 reverses the semiconductor substrate W. The semiconductor substrate W which has been reversed is picked up by the first robot 703, and transferred to the third cleaning machine 704. In the third cleaning machine 704, megasonic water excited by ultrasonic vibrations is ejected toward the surface of the semiconductor substrate W to clean the semiconductor substrate W. At this time, the surface of the semiconductor substrate W may be cleaned with a known pencil type sponge using a cleaning liquid comprising pure water to which a surface active agent, a chelating agent, or a pH regulating agent is added. Thereafter, the semiconductor substrate W is dried by spin-drying.

As described above, if the film thickness has been measured with the film thickness measuring instrument 711-4 provided near the polishing table 711-1, then the semiconductor substrate W is not subjected to further process and is accommodated into the cassette placed on the unloading port of the loading/unloading unit 701.

Figure 18:
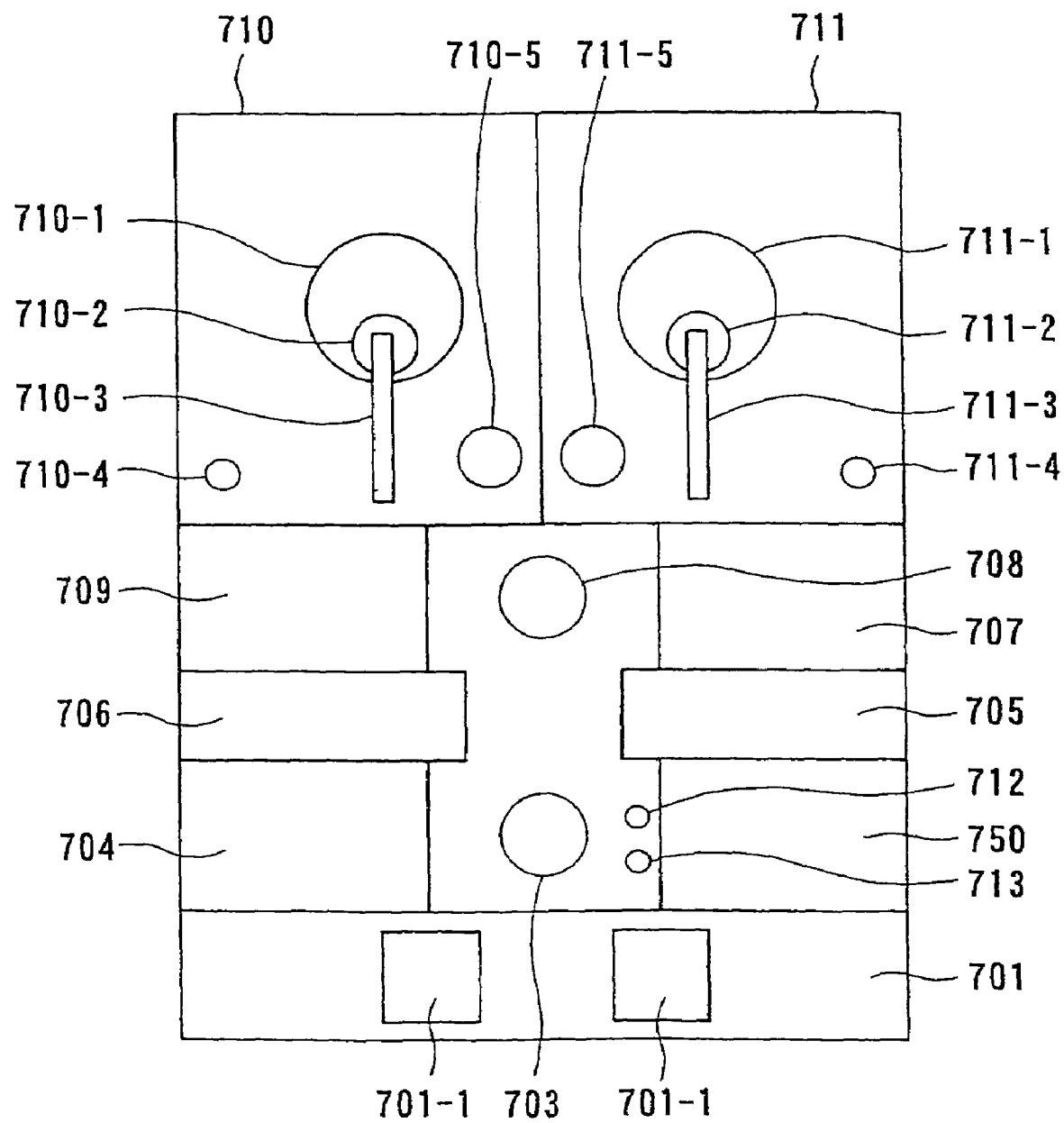
FIG. 18 is a view showing another plan constitution example of the semiconductor substrate processing apparatus.

FIG. 18 is a view showing the plan constitution of another example of a semiconductor substrate processing apparatus. The semiconductor substrate processing apparatus differs from the semiconductor substrate processing apparatus shown in FIG. 17 in that a cap plating unit 750 is provided instead of the plated Cu film forming unit 702 in FIG. 17.

A cassette 701-1 accommodating the semiconductor substrates W on which a plated Cu film is formed is placed on a load port of a loading/unloading unit 701. The semiconductor substrate W taken out from the cassette 701-1 is transferred to the first polishing apparatus 710 or second polishing apparatus 711 in which the surface of the plated Cu film is polished. After completion of polishing of the plated Cu film, the semiconductor substrate W is cleaned in the first cleaning machine 709.

After completion of cleaning in the first cleaning machine 709, the semiconductor substrate W is transferred to the cap plating unit 750 where cap plating is applied onto the surface of the plated Cu film with the aim of preventing oxidation of plated Cu film due to the atmosphere. The semiconductor substrate to which cap plating has been applied is carried by the second robot 708 from the cap plating unit 750 to the second cleaning machine 707 where it is cleaned with pure water or deionized water. The semiconductor substrate W after completion of cleaning is returned into the cassette 701-1 placed on the loading/unloading unit 701.

Figure 19:
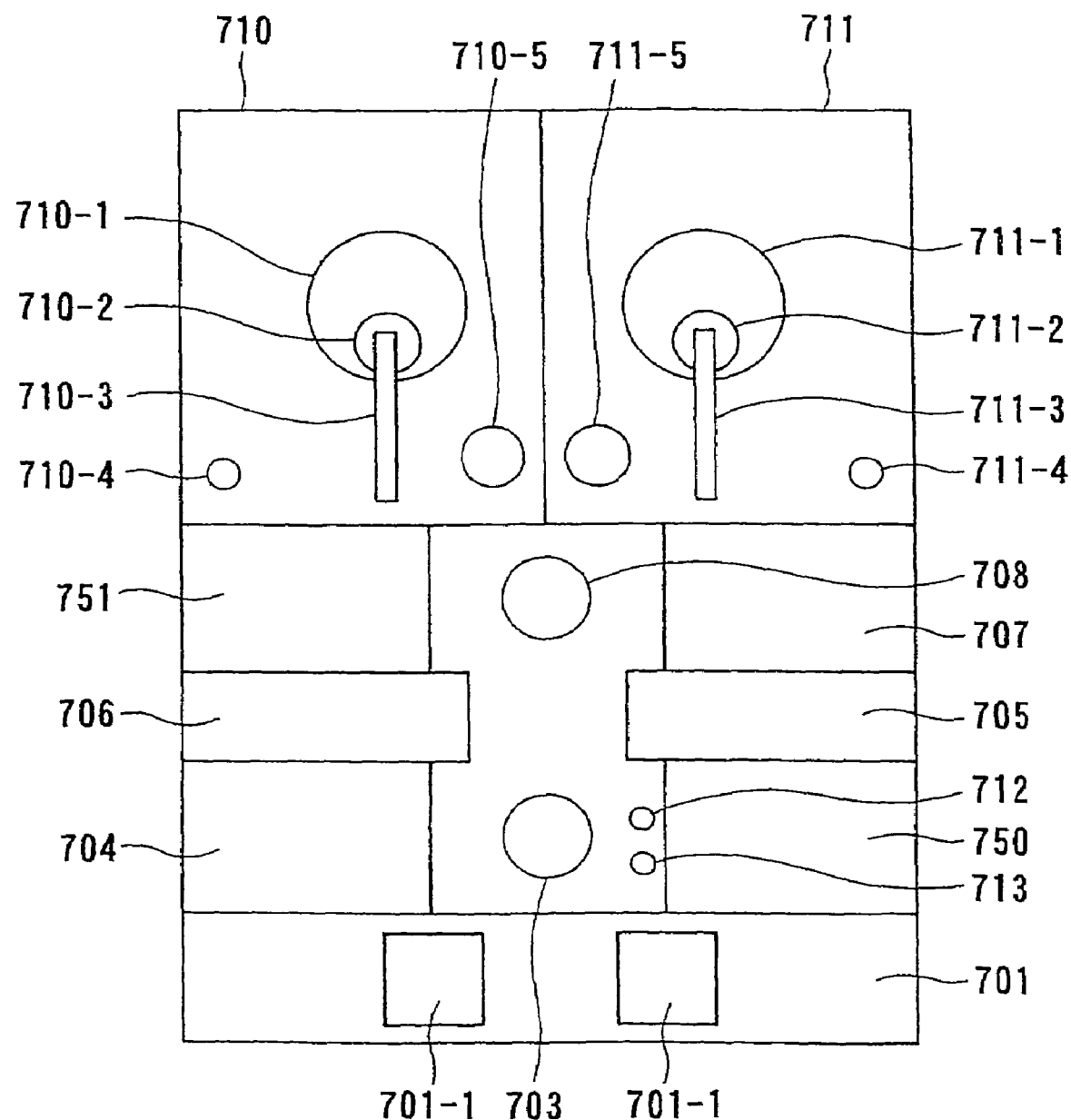
FIG. 19 is a view showing still another plan constitution example of the semiconductor substrate processing apparatus.

FIG. 19 is a view showing the plan constitution of still another example of a semiconductor substrate processing apparatus. The substrate processing apparatus differs from the substrate processing apparatus shown in FIG. 18 in that an annealing unit 751 is provided instead of the first cleaning machine 709 in FIG. 18.

The semiconductor substrate W, which is polished in the first polishing unit 710 or second polishing unit 711, and cleaned in the second cleaning machine 707 described above, is transferred to the cap plating unit 750 where cap plating is applied onto the surface of the plated Cu film. The semiconductor substrate W to which cap plating has been applied is carried by the first robot 703 from the cap plating unit 750 to the third cleaning machine 704 where it is cleaned.

After completion of cleaning in the first cleaning machine 709, the semiconductor substrate W is transferred to the annealing unit 751 in which the substrate W is annealed, whereby the plated Cu film is alloyed so as to increase the electromigration resistance of the plated Cu film. The semiconductor substrate W to which annealing treatment has been applied is carried from the annealing unit 751 to the second cleaning machine 707 where it is cleaned with pure water or deionized water. The semiconductor substrate W after completion of cleaning is returned into the cassette 701-1 placed on the loading/unloading unit 701.

Figure 20:
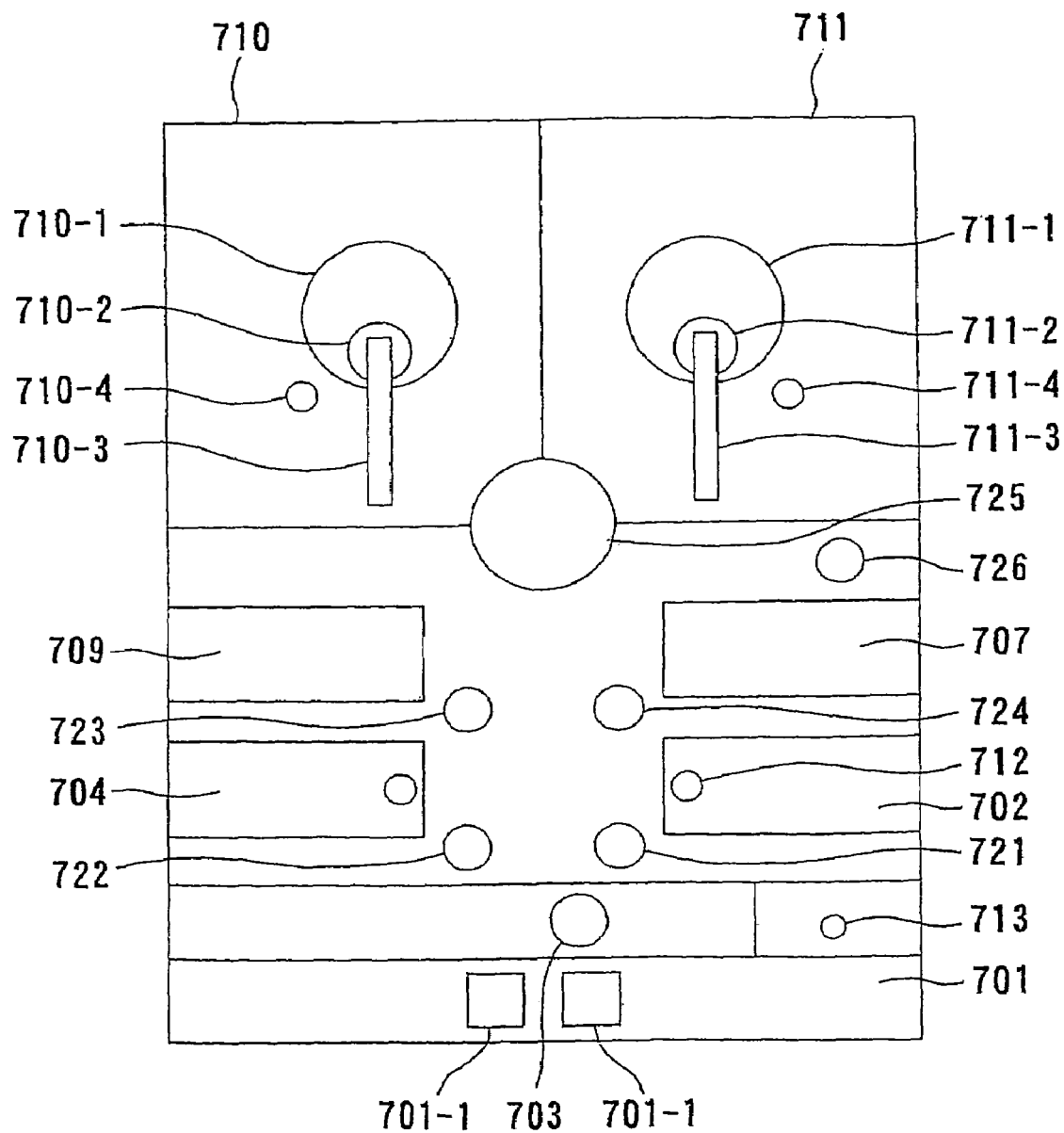
FIG. 20 is a view showing still another plan constitution example of the semiconductor substrate processing apparatus.

FIG. 20 is a view showing a plan layout constitution of another example of the substrate processing apparatus. In FIG. 20, portions denoted by the same reference numerals as those in FIG. 17 show the same or corresponding portions. In the substrate processing apparatus, a pusher indexer 725 is disposed close to a first polishing apparatus 710 and a second polishing apparatus 711. Substrate placing tables 721, 722 are disposed close to a third cleaning machine 704 and a plated Cu film forming unit 702, respectively. A robot 723 is disposed close to a first cleaning machine 709 and the third cleaning machine 704. Further, a robot 724 is disposed close to a second cleaning machine 707 and the plated Cu film forming unit 702, and a dry state film thickness measuring instrument 713 is disposed close to a loading/unloading unit 701 and a first robot 703.

In the substrate processing apparatus of the above constitution, the first robot 703 takes out a semiconductor substrate W from a cassette 701-1 placed on the load port of the loading/unloading unit 701. After the film thicknesses of a barrier layer and a seed layer are measured with the dry state film thickness measuring instrument 713, the first robot 703 places the semiconductor substrate W on the substrate placing table 721. In the case where the dry state film thickness measuring instrument 713 is provided on the hand of the first robot 703, the film thicknesses are measured thereon, and the substrate is placed on the substrate placing table 721. The second robot 723 transfers the semiconductor substrate W on the substrate placing table 721 to the plated Cu film forming unit 702 in which a plated Cu film is formed. After formation of the plated Cu film, the film thickness of the plated Cu film is measured with a before-plating and after-plating film thickness measuring instrument 712. Then, the second robot 723 transfers the semiconductor substrate W to the pusher indexer 725 and loads it thereon.

[Serial Mode]

In the serial mode, a top ring 710-2 holds the semiconductor substrate W on the pusher indexer 725 by suction, transfers it to a polishing table 710-1, and presses the semiconductor substrate W against a polishing surface on the polishing table 710-1 to perform polishing. Detection of the end point of polishing is performed by the same method as described above. The semiconductor substrate W after completion of polishing is transferred to the pusher indexer 725 by the top ring 710-2, and loaded thereon. The second robot 723 takes out the semiconductor substrate W, and carries it into the first cleaning machine 709 for cleaning. Then, the semiconductor substrate W is transferred to the pusher indexer 725, and loaded thereon.

A top ring 711-2 holds the semiconductor substrate W on the pusher indexer 725 by suction, transfers it to a polishing table 711-1, and presses the semiconductor substrate W against a polishing surface on the polishing table 711-1 to perform polishing. Detection of the end point of polishing is performed by the same method as described above. The semiconductor substrate W after completion of polishing is transferred to the pusher indexer 725 by the top ring 711-2, and loaded thereon. The third robot 724 picks up the semiconductor substrate W, and its film thickness is measured with a film thickness measuring instrument 726. Then, the semiconductor substrate W is carried into the second cleaning machine 707 for cleaning. Thereafter, the semiconductor substrate W is carried into the third cleaning machine 704, where it is cleaned and then dried by spin-drying. Then, the semiconductor substrate W is picked up by the third robot 724, and placed on the substrate placing table 722.

[Parallel Mode]

In the parallel mode, the top ring 710-2 or 711-2 holds the semiconductor substrate W on the pusher indexer 725 by suction, transfers it to the polishing table 710-1 or 711-1, and presses the semiconductor substrate W against the polishing surface on the polishing table 710-1 or 711-1 to perform polishing. After measurement of the film thickness, the third robot 724 picks up the semiconductor substrate W, and places it on the substrate placing table 722.

The first robot 703 transfers the semiconductor substrate W on the substrate placing table 722 to the dry state film thickness measuring instrument 713. After the film thickness is measured, the semiconductor substrate W is returned to the cassette 701-1 of the loading/unloading unit 701.

Figure 21:
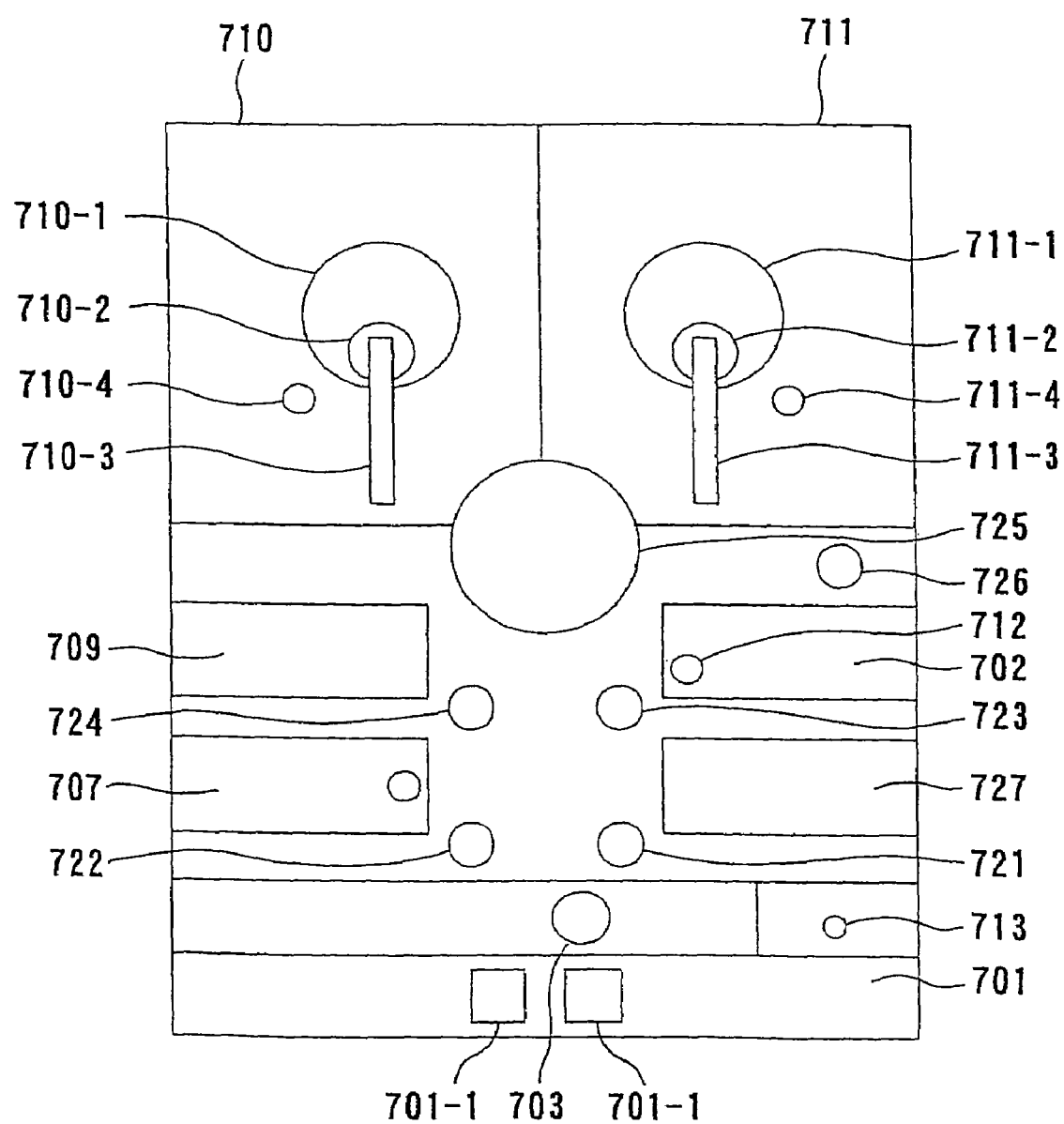
FIG. 21 is a view showing still another plan constitution example of the semiconductor substrate processing apparatus.

FIG. 21 is a view showing another plan layout constitution of the substrate processing apparatus. The substrate processing apparatus is such a substrate processing apparatus which forms a seed layer and a plated Cu film on a semiconductor substrate W having no seed layer formed thereon, and polishes these films to form interconnections.

In the substrate polishing apparatus, a pusher indexer 725 is disposed close to a first polishing apparatus 710 and a second polishing apparatus 711, substrate placing tables 721, 722 are disposed close to a second cleaning machine 707 and a seed layer forming unit 727, respectively, and a robot 723 is disposed close to the seed layer forming unit 727 and a plated Cu film forming unit 702. Further, a robot 724 is disposed close to a first cleaning machine 709 and the second cleaning machine 707, and a dry state film thickness measuring instrument 713 is disposed close to a loading/unloading unit 701 and a first robot 703.

The first robot 703 takes out a semiconductor substrate W having a barrier layer thereon from a cassette 701-1 placed on the load port of the loading/unloading unit 701, and places it on the substrate placing table 721. Then, the second robot 723 transfers the semiconductor substrate W to the seed layer forming unit 727 where a seed layer is formed. The seed layer is formed by electroless plating. The second robot 723 enables the semiconductor substrate having the seed layer formed thereon to be measured in thickness of the seed layer by the before-plating and after-plating film thickness measuring instrument 712. After measurement of the film thickness, the semiconductor substrate is carried into the plated Cu film forming unit 702 where a plated Cu film is formed.

After formation of the plated Cu film, its film thickness is measured, and the semiconductor substrate is transferred to a pusher indexer 725. A top ring 710-2 or 711-2 holds the semiconductor substrate W on the pusher indexer 725 by suction, and transfers it to a polishing table 710-1 or 711-1 to perform polishing. After polishing, the top ring 710-2 or 711-2 transfers the semiconductor substrate W to a film thickness measuring instrument 710-4 or 711-4 to measure the film thickness. Then, the top ring 710-2 or 711-2 transfers the semiconductor substrate W to the pusher indexer 725, and places it thereon.

Then, the third robot 724 picks up the semiconductor substrate W from the pusher indexer 725, and carries it into the first cleaning machine 709. The third robot 724 picks up the cleaned semiconductor substrate W from the first cleaning machine 709, carries it into the second cleaning machine 707, and places the cleaned and dried semiconductor substrate on the substrate placing table 722. Then, the first robot 703 picks up the semiconductor substrate W, and transfers it to the dry state film thickness measuring instrument 713 in which the film thickness is measured, and the first robot 703 carries it into the cassette 701-1 placed on the unload port of the loading/unloading unit 701.

In the substrate processing apparatus shown in FIG. 21, interconnections are formed by forming a barrier layer, a seed layer and a plated Cu film on a semiconductor substrate W having a contact hole or a trench of a circuit pattern formed therein, and polishing them.

The cassette 701-1 accommodating the semiconductor substrates W before formation of the barrier layer is placed on the load port of the loading/unloading unit 701. The first robot 703 takes out the semiconductor substrate W from the cassette 701-1 placed on the load port of the loading/unloading unit 701, and places it on the substrate placing table 721. Then, the second robot 723 transfers the semiconductor substrate W to the seed layer forming unit 727 where a barrier layer and a seed layer are formed. The barrier layer and the seed layer are formed by electroless plating. The second robot 723 brings the semiconductor substrate W having the barrier layer and the seed layer formed thereon to the before-plating and after-plating film thickness measuring instrument 712 which measures the film thicknesses of the barrier layer and the seed layer. After measurement of the film thicknesses, the semiconductor substrate W is carried into the plated Cu film forming unit 702 where a plated Cu film is formed.

Figure 22:
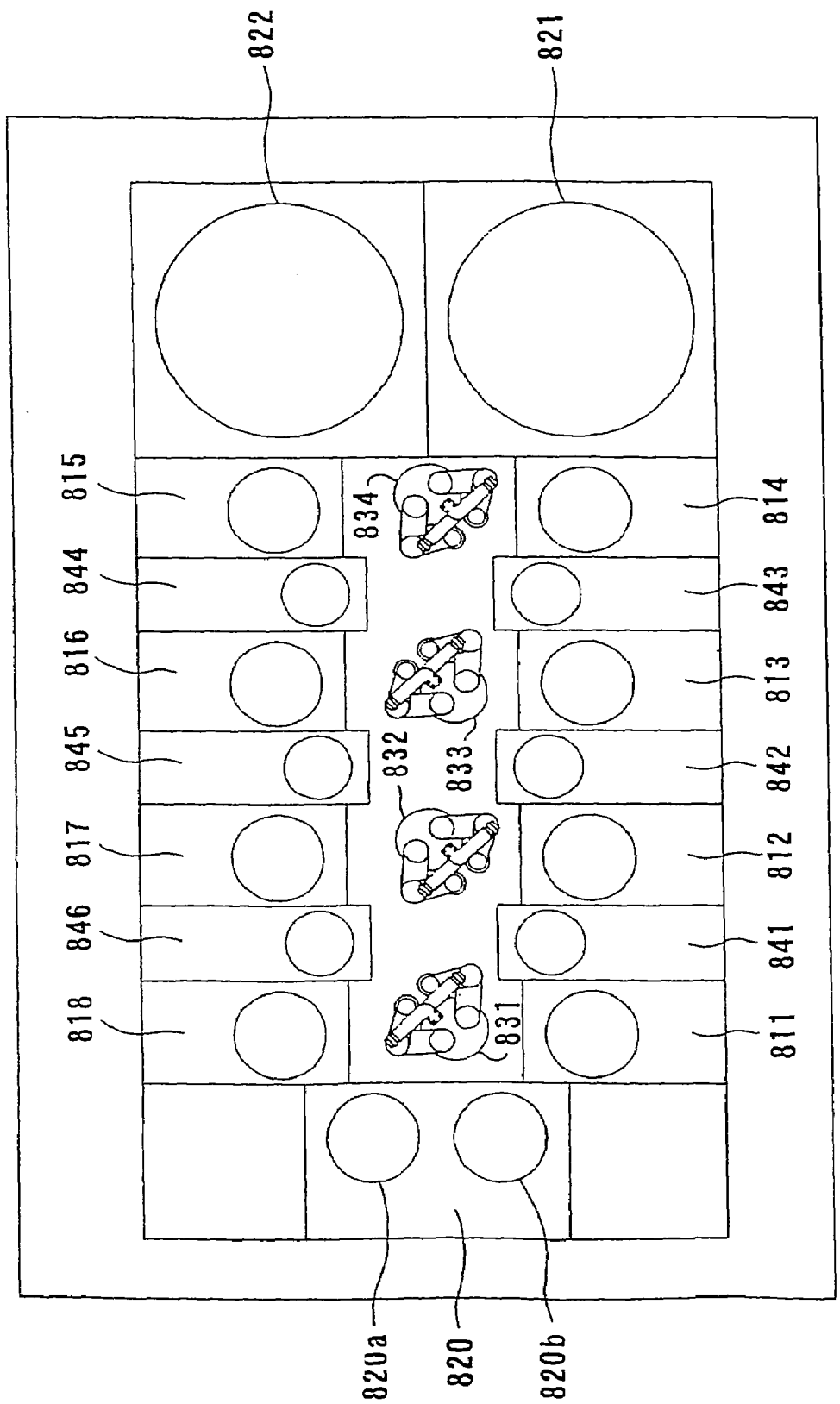
FIG. 22 is a view showing still another plan constitution example of the semiconductor substrate processing apparatus.

FIG. 22 is a view showing plan layout constitution of another example of the substrate processing apparatus. In the substrate processing apparatus, there are provided a barrier layer forming unit 811, a seed layer forming unit 812, a plated film forming unit 813, an annealing unit 814, a first cleaning unit 815, a bevel and backside cleaning unit 816, a cap plating unit 817, a second cleaning unit 818, a first aligner and film thickness measuring instrument 841, a second aligner and film thickness measuring instrument 842, a first substrate reversing machine 843, a second substrate reversing machine 844, a substrate temporary placing table 845, a third film thickness measuring instrument 846, a loading/unloading unit 820, a first polishing apparatus 821, a second polishing apparatus 822, a first robot 831, a second robot 832, a third robot 833, and a fourth robot 834. The film thickness measuring instruments 841, 842, and 846 are units, have the same size as the frontage dimension of other units (plating, cleaning, annealing units, and the like), and are thus interchangeable.

In this example, an electroless Co—W plating apparatus can be used as the barrier layer forming unit 811, an electroless Cu plating apparatus as the seed layer forming unit 812, and an electroplating apparatus as the plated film forming unit 813.

Figure 23:
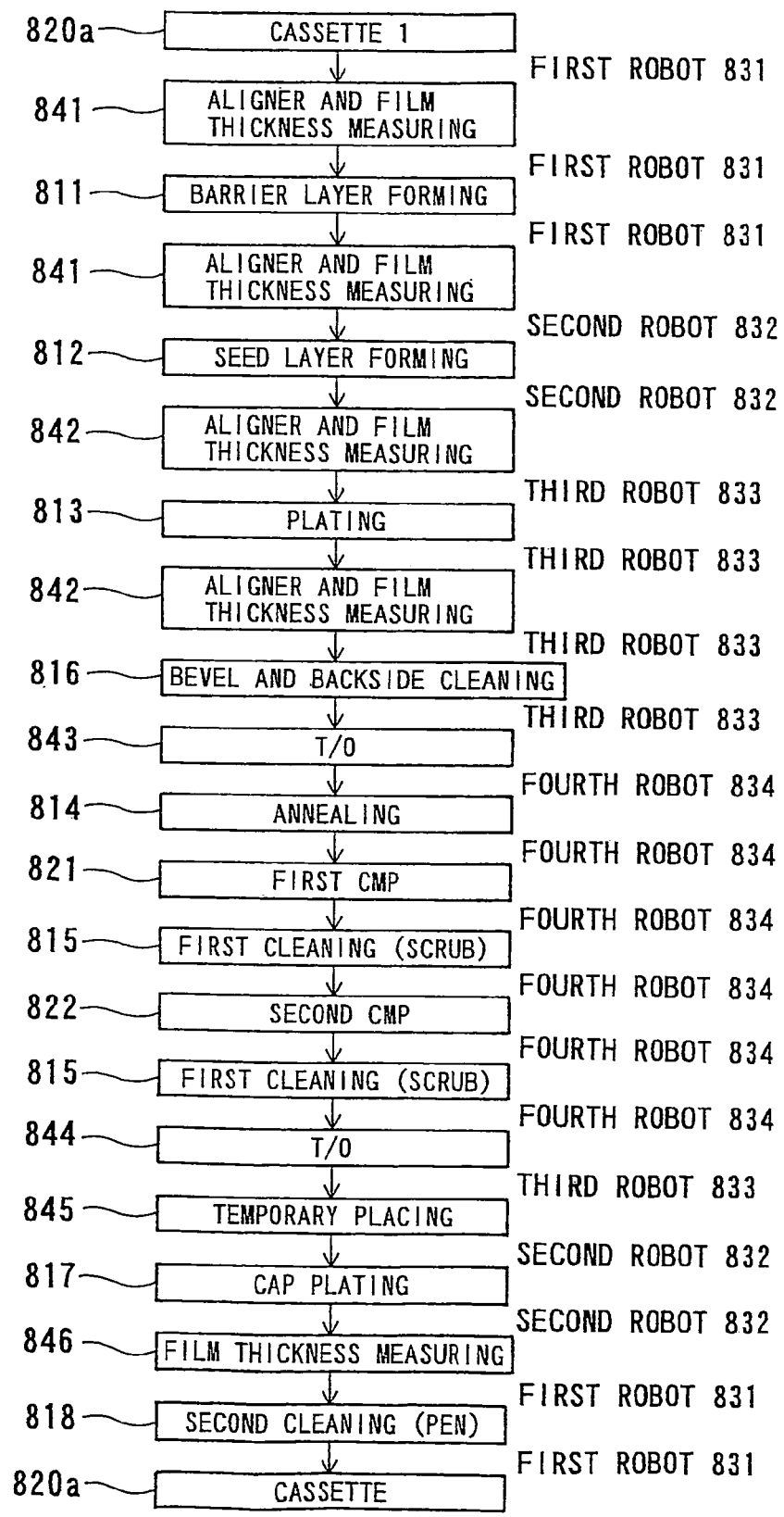
FIG. 23 is a view showing a flow of the respective steps in the semiconductor substrate processing apparatus illustrated in FIG. 22.

FIG. 23 is a flow chart showing the flow of the respective steps in the present substrate processing apparatus. The respective steps in the apparatus will be described according to this flow chart. First, a semiconductor substrate taken out by the first robot 831 from a cassette 820a placed on the load and unload unit 820 is placed in the first aligner and film thickness measuring instrument 841, in such a state that its surface, to be plated, faces upward. In order to set a reference point for a position at which film thickness measurement is made, notch alignment for film thickness measurement is performed, and then film thickness data on the semiconductor substrate before formation of a Cu film are obtained.

Then, the semiconductor substrate is transferred to the barrier layer forming unit 811 by the first robot 831. The barrier layer forming unit 811 is such an apparatus for forming a barrier layer on the semiconductor substrate by electroless Co—W plating, and the barrier layer forming unit 811 forms a Co—W film as a film for preventing Cu from diffusing into an interlayer insulator film (e.g., $SiO_2$) of a semiconductor device. The semiconductor substrate discharged after cleaning and drying steps is transferred by the first robot 831 to the first aligner and film thickness measuring instrument 841, where the film thickness of the semiconductor substrate, i.e., the film thickness of the barrier layer is measured.

The semiconductor substrate after film thickness measurement is carried into the seed layer forming unit 812 by the second robot 832, and a seed layer is formed on the barrier layer by electroless Cu plating. The semiconductor substrate discharged after cleaning and drying steps is transferred by the second robot 832 to the second aligner and film thickness measuring instrument 842 for determination of a notch position, before the semiconductor substrate is transferred to the plated film forming unit 813, which is an impregnation plating unit, and then notch alignment for Cu plating is performed by the film thickness measuring instrument 842. If necessary, the film thickness of the semiconductor substrate before formation of a Cu film may be measured again in the film thickness measuring instrument 842.

The semiconductor substrate which has completed notch alignment is transferred by the third robot 833 to the plated film forming unit 813 where Cu plating is applied to the semiconductor substrate. The semiconductor substrate discharged after cleaning and drying steps is transferred by the third robot 833 to the bevel and backside cleaning unit 816 where an unnecessary Cu film (seed layer) at a peripheral portion of the semiconductor substrate is removed. In the bevel and backside cleaning unit 816, the bevel is etched in a preset time, and Cu adhering to the backside of the semiconductor substrate is cleaned with a chemical liquid such as hydrofluoric acid. At this time, before transferring the semiconductor substrate to the bevel and backside cleaning unit 816, film thickness measurement of the semiconductor substrate may be made by the second aligner and film thickness measuring instrument 842 to obtain the thickness value of the Cu film formed by plating, and based on the obtained results, the bevel etching time may be changed arbitrarily to carry out etching. The region etched by bevel etching is a region which corresponds to a peripheral edge portion of the substrate and has no circuit formed therein, or a region which is not utilized finally as a chip although a circuit is formed. A bevel portion is included in this region.

The semiconductor substrate discharged after cleaning and drying steps in the bevel and backside cleaning unit 816 is transferred by the third robot 833 to the substrate reversing machine 843. After the semiconductor substrate is turned over by the substrate reversing machine 843 to cause the plated surface to be directed downward, the semiconductor substrate is introduced into the annealing unit 814 by the fourth robot 834 for thereby stabilizing an interconnection portion. Before and/or after annealing treatment, the semiconductor substrate is carried into the second aligner and film thickness measuring instrument 842 where the film thickness of a copper film formed on the semiconductor substrate is measured. Then, the semiconductor substrate is carried by the fourth robot 834 into the first polishing apparatus 821 in which the Cu film and the seed layer of the semiconductor substrate are polished.

At this time, desired abrasive grains or the like are used, but fixed abrasive may be used in order to prevent dishing and enhance flatness of the face. After completion of primary polishing, the semiconductor substrate is transferred by the fourth robot 834 to the first cleaning unit 815 where it is cleaned. This cleaning is scrub-cleaning in which rolls having substantially the same length as the diameter of the semiconductor substrate are placed on the face and the backside of the semiconductor substrate, and the semiconductor substrate and the rolls are rotated, while pure water or deionized water is flowed, thereby performing cleaning of the semiconductor substrate.

After completion of the primary cleaning, the semiconductor substrate is transferred by the fourth robot 834 to the second polishing apparatus 822 where the barrier layer on the semiconductor substrate is polished. At this time, desired abrasive grains or the like are used, but fixed abrasive may be used in order to prevent dishing and enhance flatness of the face. After completion of secondary polishing, the semiconductor substrate is transferred by the fourth robot 834 again to the first cleaning unit 815 where scrub-cleaning is performed. After completion of cleaning, the semiconductor substrate is transferred by the fourth robot 834 to the second substrate reversing machine 844 where the semiconductor substrate is reversed to cause the plated surface to be directed upward, and then the semiconductor substrate is placed on the substrate temporary placing table 845 by the third robot.

The semiconductor substrate is transferred by the second robot 832 from the substrate temporary placing table 845 to the cap plating unit 817 where cap plating is applied onto the Cu surface with the aim of preventing oxidation of Cu due to the atmosphere. The semiconductor substrate to which cap plating has been applied is carried by the second robot 832 from the cap plating unit 817 to the third film thickness measuring instrument 846 where the thickness of the copper film is measured. Thereafter, the semiconductor substrate is carried by the first robot 831 into the second cleaning unit 818 where it is cleaned with pure water or deionized water.

The semiconductor substrate after completion of cleaning is returned into the cassette 820a placed on the loading/unloading unit 820.

The aligner and film thickness measuring instrument 841 and the aligner and film thickness measuring instrument 842 perform positioning of the notch portion of the substrate and measurement of the film thickness.

Figure 24:
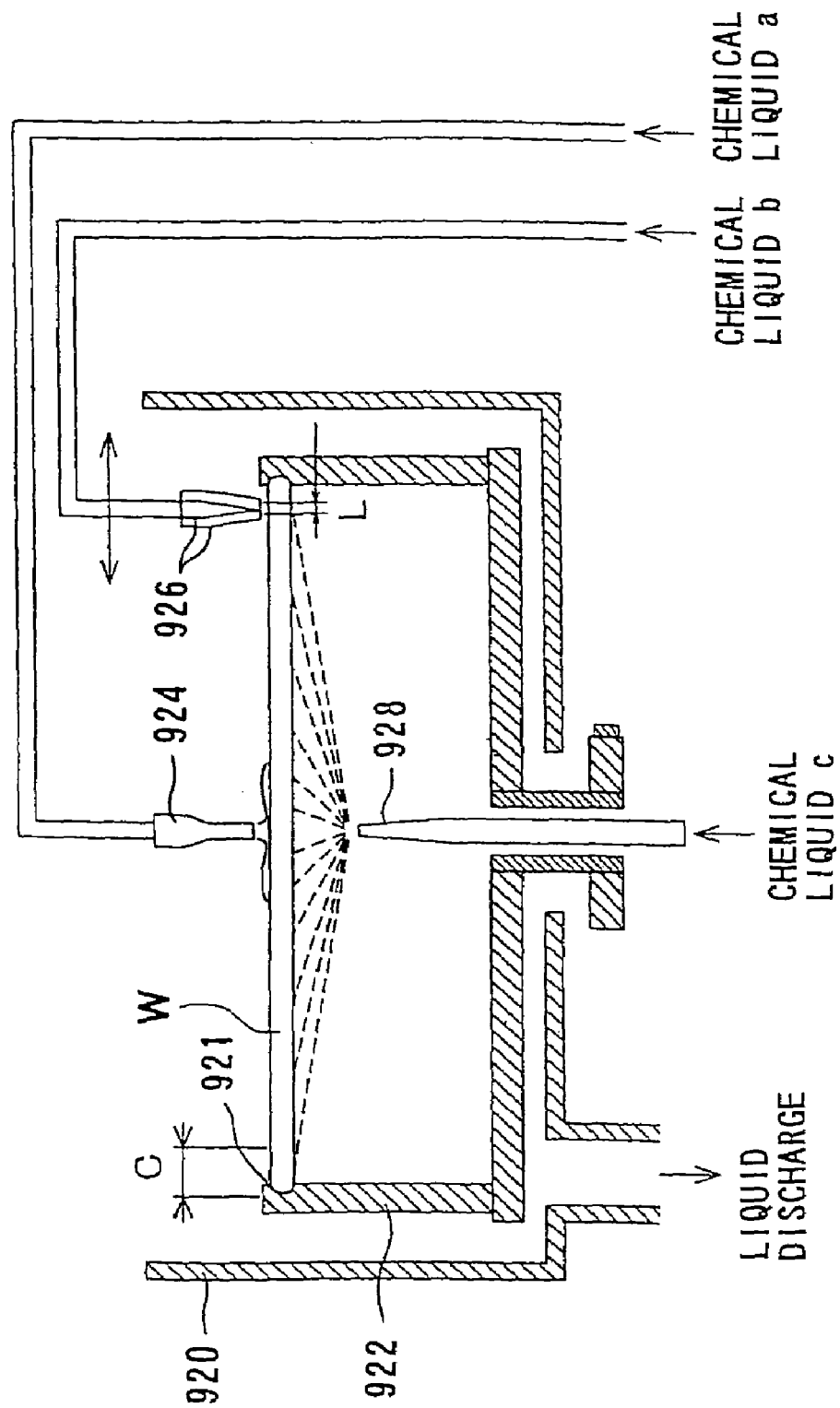
FIG. 24 is a view showing a schematic constitution example of a bevel and backside cleaning unit.

The bevel and backside cleaning unit 816 can perform an edge (bevel) Cu etching and a backside cleaning at the same time, and can suppress growth of a natural oxide film of copper at the circuit formation portion on the surface of the substrate. FIG. 24 shows a schematic view of the bevel and backside cleaning unit 816. As shown in FIG. 24, the bevel and backside cleaning unit 816 has a substrate holding portion 922 positioned inside a bottomed cylindrical waterproof cover 920 and is adapted to rotate a substrate W at a high speed, in such a state that the face of the substrate W faces upward, while holding the substrate W horizontally by spin chucks 921 at a plurality of locations along a circumferential direction of a peripheral edge portion of the substrate, a center nozzle 924 placed above a nearly central portion of the face of the substrate W held by the substrate holding portion 922, and an edge nozzle 926 placed above the peripheral edge portion of the substrate W. The center nozzle 924 and the edge nozzle 926 are directed downward. A back nozzle 928 is positioned below a nearly central portion of the backside of the substrate W, and directed upward. The edge nozzle 926 is adapted to be movable in a diametrical direction and a height direction of the substrate W.

The width of movement L of the edge nozzle 926 is set such that the edge nozzle 926 can be arbitrarily positioned in a direction toward the center from the outer peripheral end surface of the substrate, and a set value for L is inputted according to the size, usage, or the like of the substrate W. Normally, an edge cut width C is set in the range of 2 mm to 5 mm. In the case where a rotational speed of the substrate is a certain value or higher at which the amount of liquid migration from the backside to the face is not problematic, the copper film within the edge cut width C can be removed.

Next, the method of cleaning with this cleaning apparatus will be described. First, the semiconductor substrate W is horizontally rotated integrally with the substrate holding portion 922, with the substrate being held horizontally by the spin chucks 921 of the substrate holding portion 922. In this state, an acid solution is supplied from the center nozzle 924 to the central portion of the face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to the peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, the copper film, or the like formed on the upper surface and end surface in the region of the peripheral edge portion of the semiconductor substrate W is rapidly oxidized with the oxidizing agent solution, and is simultaneously etched with the acid solution supplied from the center nozzle 924 and spread on the entire face of the substrate, whereby it is dissolved and removed. By mixing the acid solution and the oxidizing agent solution at the peripheral edge portion of the substrate, a steep etching profile can be obtained, in comparison with a mixture of them which is produced in advance being supplied. At this time, the copper etching rate is determined by their concentrations. If a natural oxide film of copper is formed in the circuit-formed portion on the face of the substrate, this natural oxide is immediately removed by the acid solution spreading on the entire face of the substrate according to rotation of the substrate, and does not grow any more. After the supply of the acid solution from the center nozzle 924 is stopped, the supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the semiconductor substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, the types of chemicals can be decreased in number. Thus, if the supply of the oxidizing agent is stopped first, a hydrophobic surface is obtained. If the etching agent solution is stopped first, a water-saturated surface (a hydrophilic surface) is obtained, and thus the backside surface can be adjusted to a condition which will satisfy the requirements of a subsequent process.

In this manner, the acid solution, i.e., etching solution, is supplied to the substrate to remove metal ions remaining on the surface of the substrate W. Then, pure water is supplied to replace the etching solution with pure water and remove the etching solution, and then the substrate is dried by spin-drying. In this way, removal of the copper film in the edge cut width C at the peripheral edge portion on the face of the semiconductor substrate, and removal of copper contaminants on the backside are performed simultaneously to thus allow this treatment to be completed, for example, within 80 seconds. The etching cut width of the edge can be set arbitrarily (from 2 to 5 mm), but the time required for etching does not depend on the cut width.

Annealing treatment performed before the CMP process and after plating has a favorable effect on the subsequent CMP treatment and on the electrical characteristics of interconnection. Observation of the surface of broad interconnection (unit of several micrometers) after the CMP treatment without annealing showed many defects such as microvoids, which resulted in an increase in the electrical resistance of the entire interconnection. Execution of annealing ameliorated the increase in the electrical resistance. In the presence of annealing, thin interconnection showed no voids. Thus, the degree of grain growth is presumed to be involved in these phenomena. That is, the following mechanism can be speculated. Grain growth is difficult to occur in thin interconnection. In broad interconnection, on the other hand, grain growth proceeds in accordance with annealing treatment. During the process of grain growth, ultra-fine pores in the plated film, which are too small to be seen by the SEM (scanning electron microscope), gather and move upward, thus forming microvoid-like depressions in the upper part of the interconnection. The annealing conditions in the annealing unit 814 are such that hydrogen (2% or less) is added in a gas atmosphere, the temperature is in the range of 300° C. to 400° C., and the time is in the range of 1 to 5 minutes. Under these conditions, the above effects were obtained.

Figure 27:
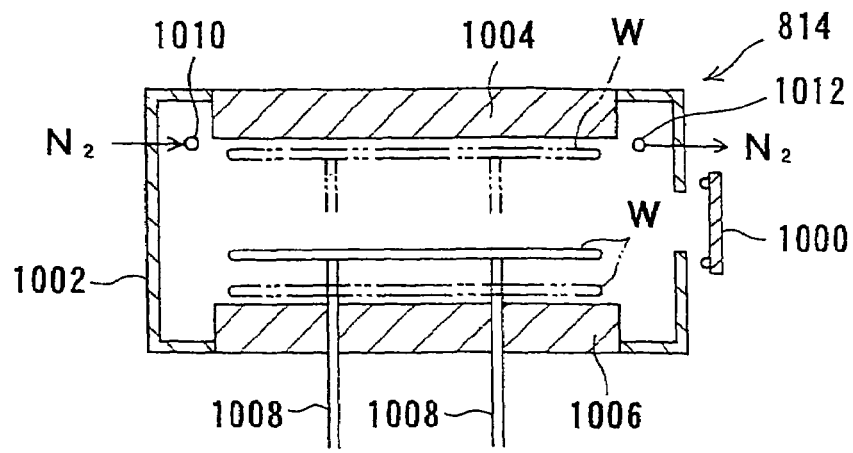
FIG. 27 is a vertical sectional view of an example of an annealing unit.
Figure 28:
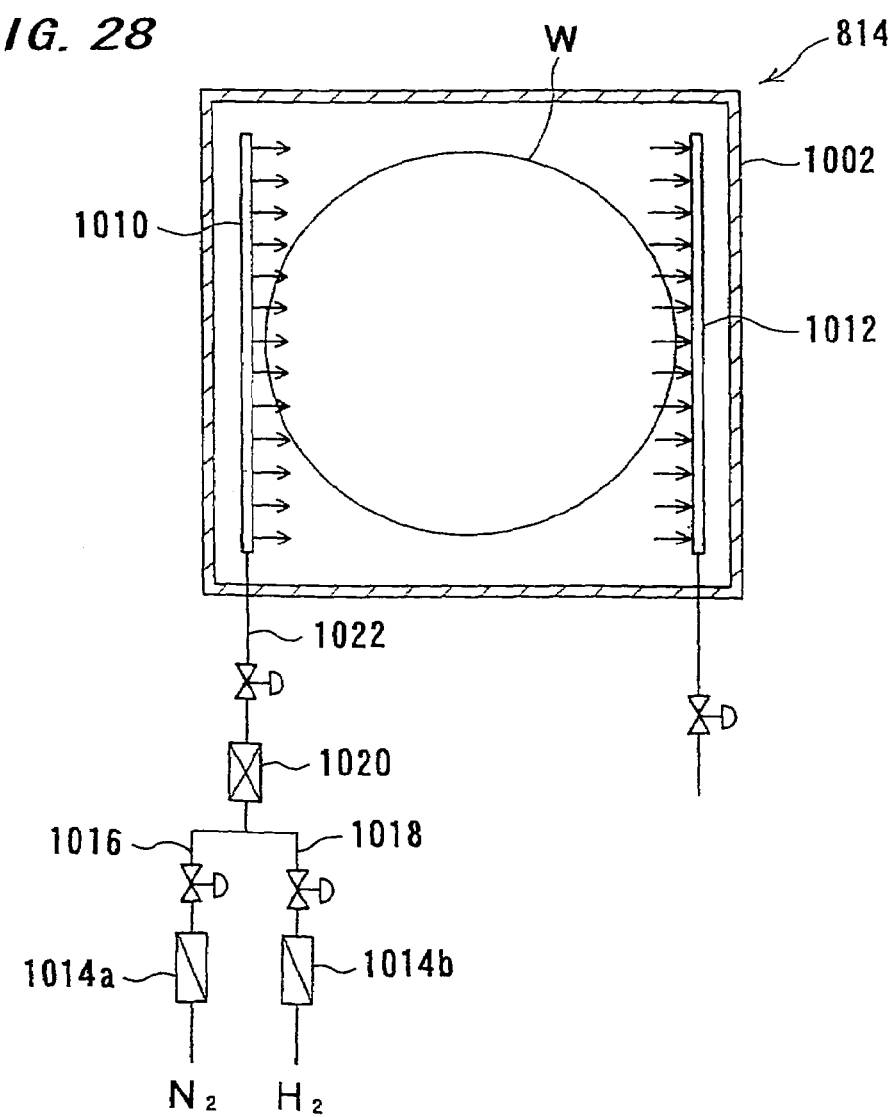
FIG. 28 is a transverse sectional view of the annealing unit.

FIGS. 27 and 28 show the annealing unit 814. The annealing unit 814 comprises a chamber 1002 having a gate 1000 for taking in and taking out the semiconductor substrate W, a hot plate 1004 disposed at an upper position in the chamber 1002 for heating the semiconductor substrate W to, e.g., 400° C., and a cool plate 1006 disposed at a lower position in the chamber 1002 for cooling the semiconductor substrate W by, for example, flowing cooling water inside the plate. The annealing unit 814 also has a plurality of vertically movable elevating pins 1008 penetrating the cool plate 1006 and extending upward and downward therethrough for placing and holding the semiconductor substrate W on them. The annealing unit further includes a gas introduction pipe 1010 for introducing an antioxidant gas between the semiconductor substrate W and the hot plate 1004 during annealing, and a gas discharge pipe 1012 for discharging the gas which has been introduced from the gas introduction pipe 1010 and flowed between the semiconductor substrate W and the hot plate 1004. The pipes 1010 and 1012 are disposed on the opposite sides of the hot plate 1004.

The gas introduction pipe 1010 is connected to a mixed gas introduction line 1022 which in turn is connected to a mixer 1020 where a $N_2$ gas introduced through a $N_2$ gas introduction line 1016 containing a filter 1014a, and a $H_2$ gas introduced through a $H_2$ gas introduction line 1018 containing a filter 1014b, are mixed to form a mixed gas which flows through the line 1022 into the gas introduction pipe 1010.

In operation, the semiconductor substrate W, which has been carried in the chamber 1002 through the gate 1000, is held on the elevating pins 1008 and the elevating pins 1008 are raised up to a position at which the distance between the semiconductor substrate W held on the lifting pins 1008 and the hot plate 1004 becomes, e.g., 0.1–1.0 mm. In this state, the semiconductor substrate W is then heated to, e.g., 400° C. through the hot plate 1004 and, at the same time, the antioxidant gas is introduced from the gas introduction pipe 1010 and the gas is allowed to flow between the semiconductor substrate W and the hot plate 1004 while the gas is discharged from the gas discharge pipe 1012, thereby annealing the semiconductor substrate W while preventing its oxidation. The annealing treatment may be completed in about several tens of seconds to 60 seconds. The heating temperature of the substrate may be selected in the range of 100–600° C.

After the completion of the annealing, the elevating pins 1008 are lowered down to a position at which the distance between the semiconductor substrate W held on the elevating pins 1008 and the cool plate 1006 becomes, e.g., 0–0.5 mm. In this state, by introducing cooling water into the cool plate 1006, the semiconductor substrate W is cooled by the cool plate to a temperature of 100° C. or lower in, e.g., 10–60 seconds. The cooled semiconductor substrate is sent to the next step.

A mixed gas of $N_2$ gas with several percentages of $H_2$ gas is used as the above antioxidant gas. However, $N_2$ gas may be used singly.

Figure 25:
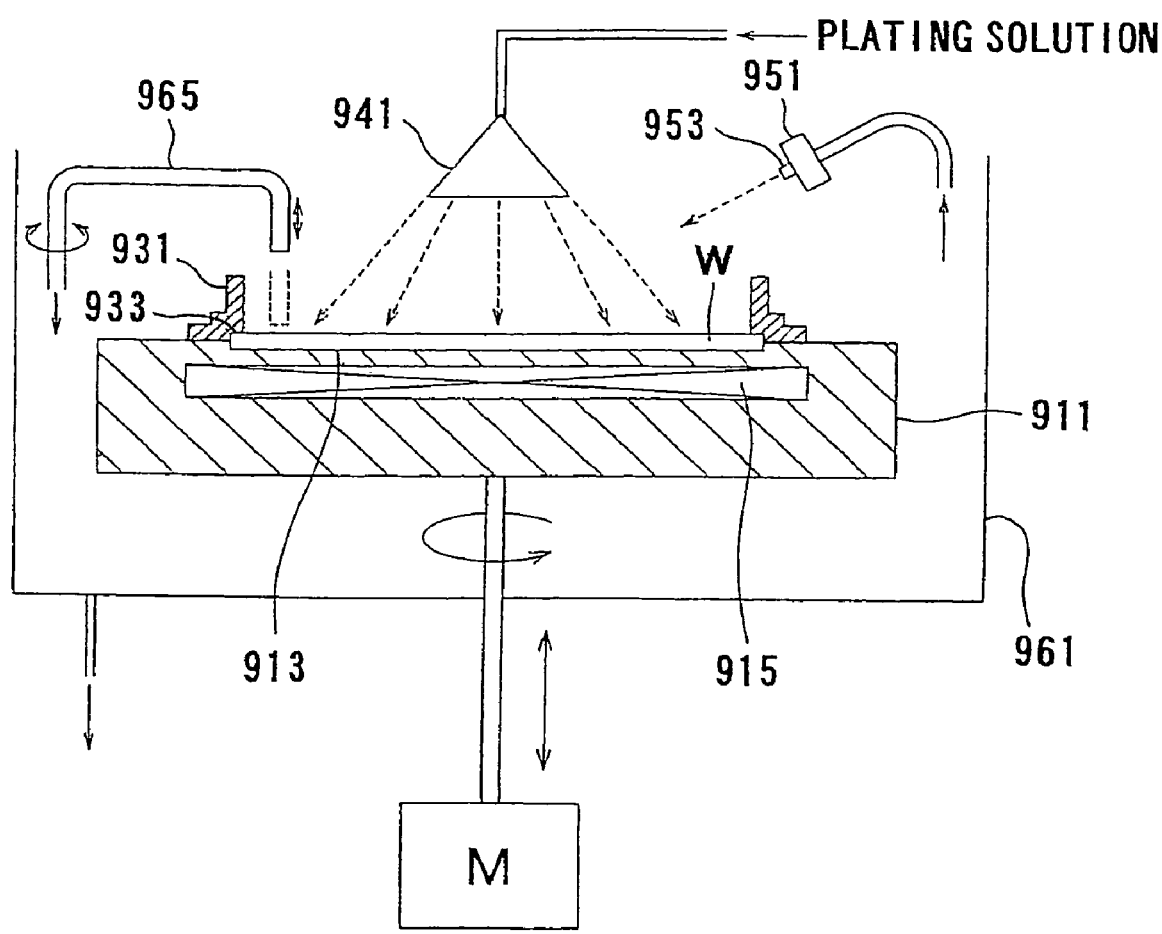
FIG. 25 is a view showing a schematic constitution of an example of an electroless plating apparatus.

FIG. 25 is a schematic constitution drawing of the electroless plating apparatus. As shown in FIG. 25, this electroless plating apparatus comprises holding means 911 for holding a semiconductor substrate W to be plated on its upper surface, a dam member 931 for contacting a peripheral edge portion of a surface to be plated (upper surface) of the semiconductor substrate W held by the holding means 911 to seal the peripheral edge portion, and a shower head 941 for supplying a plating solution to the surface, to be plated, of the semiconductor substrate W having the peripheral edge portion sealed with the dam member 931. The electroless plating apparatus further comprises cleaning liquid supply means 951 disposed near an upper outer periphery of the holding means 911 for supplying a cleaning liquid to the surface, to be plated, of the semiconductor substrate W, a recovery vessel 961 for recovering a cleaning liquid or the like (plating waste liquid) discharged, a plating solution recovery nozzle 965 for sucking in and recovering the plating solution held on the semiconductor substrate W, and a motor M for rotationally driving the holding means 911. The respective members will be described below.

The holding means 911 has a substrate placing portion 913 on its upper surface for placing and holding the semiconductor substrate W. The substrate placing portion 913 is adapted to place and fix the semiconductor substrate W. Specifically, the substrate placing portion 913 has a vacuum attracting mechanism (not shown) for attracting the semiconductor substrate W to a backside thereof by vacuum suction. A backside heater 915, which is planar and heats the surface, to be plated, of the semiconductor substrate W from underside to keep it warm, is installed on the backside of the substrate placing portion 913. The backside heater 915 is composed of, for example, a rubber heater. This holding means 911 is adapted to be rotated by the motor M and is movable vertically by raising and lowering means (not shown).

The dam member 931 is tubular, has a seal portion 933 provided in a lower portion thereof for sealing the outer peripheral edge of the semiconductor substrate W, and is installed so as not to move vertically from the illustrated position.

The shower head 941 is of a structure having many nozzles provided at the front end for scattering the supplied plating solution in a shower form and supplying it substantially uniformly to the surface, to be plated, of the semiconductor substrate W. The cleaning liquid supply means 951 has a structure for ejecting a cleaning liquid from a nozzle 953.

The plating solution recovery nozzle 965 is adapted to be movable upward and downward and swingable, and the front end of the plating solution recovery nozzle 965 is adapted to be lowered inwardly of the dam member 931 located on the upper surface peripheral edge portion of the semiconductor substrate W and to suck in the plating solution on the semiconductor substrate W.

Next, the operation of the electroless plating apparatus will be described. First, the holding means 911 is lowered from the illustrated state to provide a gap of a predetermined dimension between the holding means 911 and the dam member 931, and the semiconductor substrate W is placed on and fixed to the substrate placing portion 913. An 8 inch substrate, for example, is used as the semiconductor substrate W.

Then, the holding means 911 is raised to bring its upper surface into contact with the lower surface of the dam member 931 as illustrated, and the outer periphery of the semiconductor substrate W is sealed with the seal portion 933 of the dam member 931. At this time, the surface of the semiconductor substrate W is in an open state.

Then, the semiconductor substrate W itself is directly heated by the backside heater 915 to render the temperature of the semiconductor substrate W, for example, 70° C. (maintained until termination of plating). Then, the plating solution heated, for example, to 50° C. is ejected from the shower head 941 to pour the plating solution over substantially the entire surface of the semiconductor substrate W. Since the surface of the semiconductor substrate W is surrounded by the dam member 931, the poured plating solution is all held on the surface of the semiconductor substrate W. The amount of the supplied plating solution may be a small amount which will become a 1 mm thickness (about 30 ml) on the surface of the semiconductor substrate W. The depth of the plating solution held on the surface to be plated may be 10 mm or less, and may be even 1 mm as in this embodiment. If a small amount of the supplied plating solution is sufficient, the heating apparatus for heating the plating solution may be of a small size. In this example, the temperature of the semiconductor substrate W is raised to 70° C., and the temperature of the plating solution is raised to 50° C. by heating. Thus, the surface, to be plated, of the semiconductor substrate W becomes, for example, 60° C., and hence a temperature optimal for a plating reaction in this example can be achieved.

In this manner, since the semiconductor substrate W itself is heated, it is not necessary to heat the plating solution, which would consume much electric power to be heated, to a high temperature. Therefore, electric power to be consumed can be reduced, and the plating solution can be prevented from changing in materials contained therein. The electric power required for heating the semiconductor substrate W itself and the amount of the plating solution held on the semiconductor substrate W are so small that the semiconductor substrate W can easily be kept warm by the backside heater 915. Therefore, a heater having a small thermal capacity can be used as the backside heater 915, and hence the apparatus can be made compact in size. When the semiconductor substrate W itself is cooled by a cooling mechanism, the plating conditions can be changed during the plating process by switching heating and cooling. Since the amount of the plating solution held on the semiconductor substrate is small, the temperature can be controlled with high sensitivity.

The semiconductor substrate W is instantaneously rotated by the motor M to perform uniform liquid wetting of the surface to be plated, and then plating of the surface to be plated is performed in such a state that the semiconductor substrate W is in a stationary state. Specifically, the semiconductor substrate W is rotated at 100 rpm or less for only 1 second to uniformly wet the surface, to be plated, of the semiconductor substrate W with the plating solution. Then, the semiconductor substrate W is kept stationary, and electroless plating is performed for 1 minute. The instantaneous rotating time is 10 seconds or less at the longest.

After completion of the plating treatment, the front end of the plating solution recovery nozzle 965 is lowered to an area near the inside of the dam member 931 on the peripheral edge portion of the semiconductor substrate W to suck in the plating solution. At this time, if the semiconductor substrate W is rotated at a rotational speed of, for example, 100 rpm or less, the plating solution remaining on the semiconductor substrate W can be gathered in the portion of the dam member 931 on the peripheral edge portion of the semiconductor substrate W under centrifugal force, so that recovery of the plating solution can be performed with a good efficiency and a high recovery rate. The holding means 911 is lowered to separate the semiconductor substrate W from the dam member 931. The semiconductor substrate W is started to be rotated, and the cleaning liquid (ultra-pure water) is jetted at the plated surface of the semiconductor substrate W from the nozzle 953 of the cleaning liquid supply means 951 to cool the plated surface, and simultaneously perform dilution and cleaning, thereby stopping the electroless plating reaction. At this time, the cleaning liquid jetted from the nozzle 953 may be supplied to the dam member 931 to perform cleaning of the dam member 931 at the same time. The plating waste liquid at this time is recovered into the recovery vessel 961 and discarded.

The plating solution used once is not reused, but discarded. Since the plating apparatus according to the present embodiment can use an extremely smaller amount of the plating solution than a conventional plating apparatus, even if the plating solution is not reused, the amount of the plating solution to be discarded is small. In some cases, the plating solution recovery nozzle 965 may not be provided, and the used plating solution may be recovered into the recovery vessel 961 together with the cleaning liquid.

Then, the semiconductor substrate W is rotated at a high speed by the motor M for spin-drying, and then the semiconductor substrate W is removed from the holding means 911.

Figure 26:
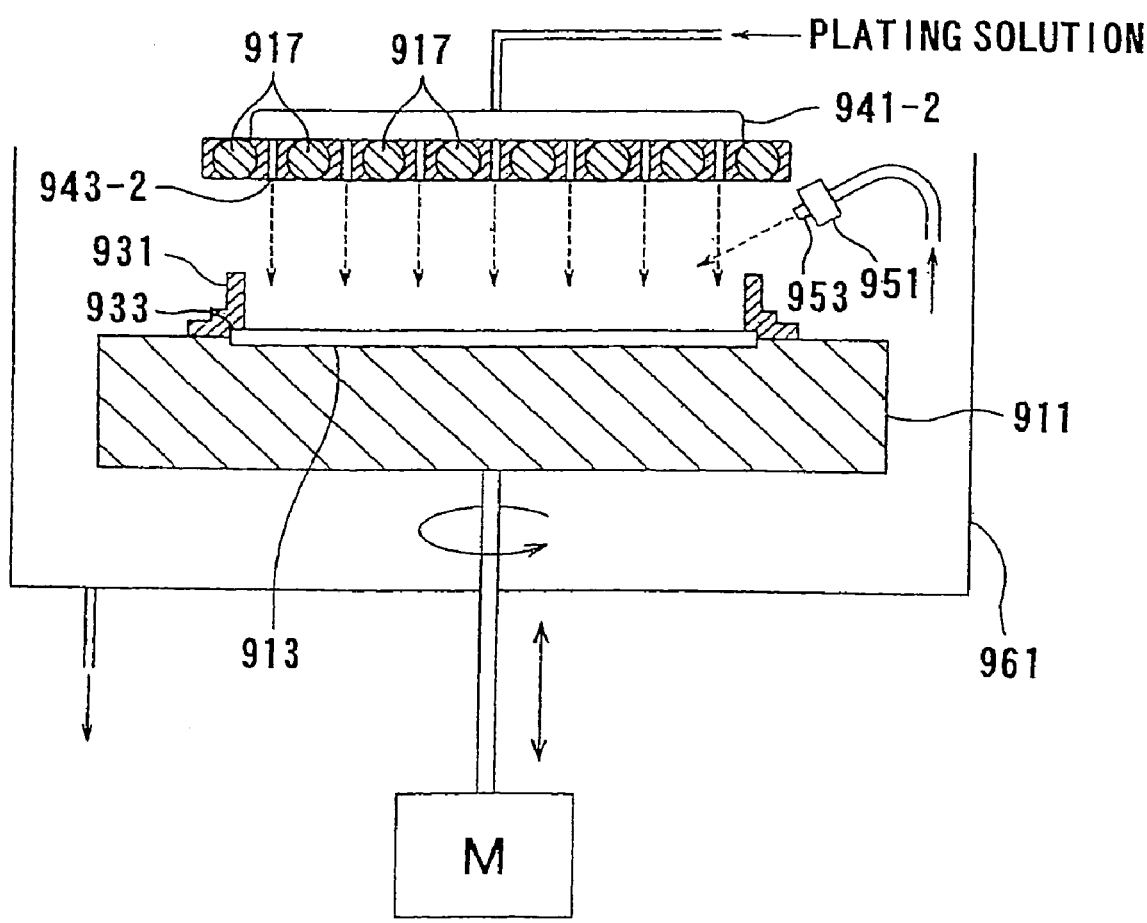
FIG. 26 is a view showing a schematic constitution of another example of an electroless plating apparatus.

FIG. 26 is a schematic constitution drawing of another electroless plating apparatus. The electroless plating apparatus of FIG. 26 is different from the electroless plating apparatus of FIG. 25 in that instead of providing the backside heater 915 in the holding means 911, lamp heaters 917 are disposed above the holding means 911, and the lamp heaters 917 and a shower head 941-2 are integrated. For example, a plurality of ring-shaped lamp heaters 917 having different radii are provided concentrically, and many nozzles 943-2 of the shower head 941-2 are open in a ring form from the gaps between the lamp heaters 917. The lamp heaters 917 may be composed of a single spiral lamp heater, or may be composed of other lamp heaters of various structures and arrangements.

Even with this constitution, the plating solution can be supplied from each nozzle 943-2 to the surface, to be plated, of the semiconductor substrate W substantially uniformly in a shower form. Further, heating and heat retention of the semiconductor substrate W can be performed by the lamp heaters 917 directly uniformly. The lamp heaters 917 heat not only the semiconductor substrate W and the plating solution, but also ambient air, thus exhibiting a heat retention effect on the semiconductor substrate W.

Direct heating of the semiconductor substrate W by the lamp heaters 917 requires the lamp heaters 917 with a relatively large electric power consumption. In place of such lamp heaters 917, lamp heaters 917 with a relatively small electric power consumption and the backside heater 915 shown in FIG. 45 may be used in combination to heat the semiconductor substrate W mainly with the backside heater 915 and to perform heat retention of the plating solution and ambient air mainly by the lamp heaters 917. In the same manner as in the aforementioned embodiment, means for directly or indirectly cooling the semiconductor substrate W may be provided to perform temperature control.

Although certain preferred embodiments of the present invention have been shown and described in detail, it should be understood that various changes and modifications may be made therein without departing from the scope of the appended claims.

INDUSTRIAL APPLICABILITY

The present invention is suitable for pretreatment of an electroless plating process by which interconnections having an electrically conductive material, such as copper or silver, are embedded in fine recesses for interconnections which are formed in the surface of a substrate such as a semiconductor substrate or by which a protective layer is formed on the surface of interconnections for protecting the surface of the interconnections. The present invention is also suitable for cleaning the surface of a substrate polished by chemical mechanical polishing (CMP) with a chemical solution.

The invention claimed is:

1. A substrate processing apparatus comprising:
   a substrate holder for detachably holding a substrate so that a face, to be processed, of the substrate faces downward;
   a sealing ring for sealing a peripheral portion of the face, to be processed, of the substrate held by said substrate holder;
   a plurality of spray nozzles disposed below said substrate holder for spraying a treatment solution toward the face, to be processed, of the substrate held by said substrate holder so as to positively supply a fresh treatment solution to the face, to be processed, of the substrate; and
   a mechanism for at least one of rotating and vertically moving said substrate holder and said plurality of spray nozzles relative to each other.

2. A substrate processing apparatus according to claim 1, wherein at least one of said plurality of spray nozzles is operable to adjust kinetic energy of mists of the treatment solution to be ejected toward the substrate held by said substrate holder, so that uniform pressure of the mists is applied to the entire face of the substrate.

3. A substrate processing apparatus according to claim 1, wherein said plurality of spray nozzles are disposed linearly along a radial direction of the substrate, and comprise a conical nozzle disposed at a central position and flat spray nozzles at side positions of said conical nozzle.

4. A substrate processing apparatus according to claim 1, wherein said plurality of spray nozzles are disposed so as to be distributed uniformly over an entire surface of the substrate held by said substrate holder.

5. A plating apparatus comprising:
   an electroless plating unit for performing an electroless plating process on a substrate; and
   a pretreatment unit for performing pretreatment of the electroless plating process in said electroless plating unit, said pretreatment unit including said substrate processing apparatus according to claim 1.

6. A plating apparatus according to claim 5, wherein said pretreatment unit comprises an adsorption processing unit for performing an adsorption process on the substrate.

7. A plating apparatus according to claim 5, wherein said pretreatment unit comprises a substitution processing unit for performing a substitution process on the substrate.

8. A plating apparatus according to claim 5, further comprising:
   a chemical mechanical polishing unit for performing a chemical mechanical polishing process on the substrate before the pretreatment in said pretreatment unit.

9. A method of processing a substrate, the method comprising:
   holding a substrate so that a face, to be processed, of the substrate faces downward;
   sealing a peripheral portion of the face, to be processed, of the substrate; and
   spraying a treatment solution toward the face, to be processed, of the substrate from a plurality of spray nozzles so as to positively supply a fresh treatment solution to the face, to be processed, of the substrate while at least one of rotating and vertically moving the substrate and the plurality of spray nozzles relative to each other.

10. A method according to claim 9, wherein the plurality of spray nozzles are disposed linearly along a radial direction of the substrate, and comprise a conical nozzle disposed at a central position and flat spray nozzles at side positions of the conical nozzle.

11. A method according to claim 9, wherein the plurality of spray nozzles are disposed so as to be distributed uniformly over an entire surface of the substrate held by said holding.

12. A method according to claim 9, further comprising:
filling a plating material into an interconnection groove formed in an insulating film of the substrate; and
polishing the plating material so as to form an interconnection in the interconnection groove after said filling and before said holding.

13. A method according to claim 12, wherein said spraying is conducted for post-treatment of said polishing.

14. A method according to claim 9, further comprising forming a protective layer on an exposed surface of the interconnection by electroless plating after said spraying.

* * * * *